United States Patent
Rohde et al.

(10) Patent No.: US 7,262,670 B2
(45) Date of Patent: Aug. 28, 2007

(54) LOW THERMAL DRIFT, TUNABLE FREQUENCY VOLTAGE CONTROLLED OSCILLATOR

(75) Inventors: Ulrich L. Rohde, Upper Saddle River, NJ (US); Ajay Kumar Poddar, Fairlawn, NJ (US); Parimal Patel, Jersey City, NJ (US); Daniel Badea, Washingtonville, NY (US); Klaus Juergen Schoepf, Ringwood, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 87 days.

(21) Appl. No.: 11/184,151

(22) Filed: Jul. 19, 2005

(65) Prior Publication Data
US 2005/0280478 A1 Dec. 22, 2005

Related U.S. Application Data

(63) Continuation-in-part of application No. 11/007,861, filed on Dec. 9, 2004.

(60) Provisional application No. 60/601,823, filed on Aug. 16, 2004, provisional application No. 60/589,090, filed on Jul. 19, 2004, provisional application No. 60/563,481, filed on Apr. 19, 2004, provisional application No. 60/528,670, filed on Dec. 11, 2003, provisional application No. 60/527,957, filed on Dec. 9, 2003.

(51) Int. Cl.
*H03B 5/12* (2006.01)
*H03B 5/18* (2006.01)

(52) U.S. Cl. .............. 331/117 R; 331/96; 331/117 D; 331/175; 331/177 V

(58) Field of Classification Search ............. 331/36 C, 331/96, 117 R, 117 FE, 117 D, 175, 177 V
See application file for complete search history.

(56) References Cited

U.S. PATENT DOCUMENTS

| | | | |
|---|---|---|---|
| 2,502,488 A | 4/1950 | Shockley | |
| 2,524,035 A | 10/1950 | Bardeen et al. | |
| 3,373,379 A | 3/1968 | Black | |
| 4,310,809 A | 1/1982 | Buck et al. | |
| 4,338,576 A | 7/1982 | Takahashi et al. | |
| 4,435,688 A | 3/1984 | Shinkawa et al. | |
| 4,527,130 A | 7/1985 | Lutteke | |
| 4,619,001 A | 10/1986 | Kane | |
| 4,621,241 A | 11/1986 | Kiser | |
| 4,633,197 A | 12/1986 | Vanderspool, II | |

(Continued)

FOREIGN PATENT DOCUMENTS

DE 3443446 A 5/1986

(Continued)

OTHER PUBLICATIONS

D. Ham, A. Hajimiri, "Concepts and Methods in Optimization of Integrated LCVCOs," IEEE Journal of Solid-state Circuits, Jun. 2001.

(Continued)

*Primary Examiner*—David Mis
(74) *Attorney, Agent, or Firm*—Lerner, David, Littenberg, Krumholz & Mentlik, LLP

(57) ABSTRACT

An oscillator comprising a cascode configured device having first, second and third terminals, a plurality of resonators and first circuitry coupled between the plurality of resonators and the second terminal of the cascode configured device. The first circuitry is preferably operable as an evanescent mode buffer to compensate for changes in the capacitance of the oscillator during operation.

26 Claims, 13 Drawing Sheets

U.S. PATENT DOCUMENTS

| | | | |
|---|---|---|---|
| 4,677,396 | A | 6/1987 | Cruz et al. |
| 4,692,714 | A | 9/1987 | Galani |
| 4,812,784 | A | 3/1989 | Chung et al. |
| 4,868,526 | A | 9/1989 | Camiade |
| 5,041,799 | A | 8/1991 | Pirez |
| 5,053,649 | A | 10/1991 | Johnson |
| 5,142,255 | A | 8/1992 | Chang et al. |
| 5,187,451 | A | 2/1993 | Nakamoto et al. |
| 5,231,361 | A | 7/1993 | Smith et al. |
| 5,363,067 | A | 11/1994 | Crandall et al. |
| 5,373,264 | A | 12/1994 | Higgins |
| 5,402,087 | A | 3/1995 | Gorczak |
| 5,434,542 | A * | 7/1995 | Veith et al. .................. 331/99 |
| 5,650,754 | A | 7/1997 | Joshi |
| 5,661,439 | A | 8/1997 | Watkins et al. |
| 5,748,051 | A | 5/1998 | Lewis |
| 5,821,410 | A | 10/1998 | Xiang et al. |
| 5,854,578 | A | 12/1998 | Minasi et al. |
| 5,900,788 | A | 5/1999 | Hagemeyer et al. |
| 6,124,767 | A | 9/2000 | Woods |
| 6,297,708 | B1 | 10/2001 | Lemay |
| 6,326,854 | B1 | 12/2001 | Nicholls et al. |
| 6,486,744 | B1 | 11/2002 | Cann et al. |
| 6,489,853 | B1 | 12/2002 | Lewis |
| 6,501,341 | B2 | 12/2002 | Mashimo et al. |
| 6,624,726 | B2 | 9/2003 | Niu |
| 6,630,869 | B2 | 10/2003 | Flynn et al. |
| 6,714,088 | B2 | 3/2004 | Chang |
| 6,714,772 | B2 | 3/2004 | Kasahara et al. |
| 6,731,181 | B2 | 5/2004 | Fukayama et al. |
| 6,734,745 | B2 | 5/2004 | Sakai |
| 6,737,928 | B2 | 5/2004 | Kubo et al. |
| 2001/0004225 | A1 | 6/2001 | Nicholls et al. |
| 2001/0030583 | A1 | 10/2001 | Ikarashi |
| 2001/0035794 | A1 | 11/2001 | Fujidai et al. |
| 2002/0084860 | A1 | 7/2002 | Festag et al. |
| 2003/0160660 | A1 | 8/2003 | Chang et al. |
| 2004/0095197 | A1 | 5/2004 | Wang et al. |
| 2004/0130402 | A1 | 7/2004 | Marquardt |
| 2005/0156683 | A1 | 7/2005 | Rohde et al. |

FOREIGN PATENT DOCUMENTS

| | | | |
|---|---|---|---|
| EP | 0 475 262 | A | 3/1992 |
| EP | 0 800 224 | A | 10/1997 |
| EP | 0 823 777 | | 2/1998 |
| EP | 0 843 374 | A | 5/1998 |
| EP | 1 093 216 | A | 4/2001 |
| JP | 59-072205 | A | 4/1984 |
| JP | 59-139708 | A | 8/1984 |
| WO | WO-02/17476 | A | 2/2002 |
| WO | WO-02/05416 | A1 | 11/2002 |

OTHER PUBLICATIONS

E. Hegazi, H. Sjoland, and A. Abidi, "A Filtering Technique to Lower LC Oscillator Phase Noise," IEEE J. Solid-State Circuits, vol. 36, pp. 1921-1929, Dec. 2001.

J. C. Nallatamby, M. Prigent, M. Camiade, J. Obregon, "Phase Noise in Oscillators-Leeson Formula Revisited," IEEE Transactions on Microwave Theory and Techniques, vol. 51, No. 4, pp. 1386-1394, Apr. 2003.

U.L. Rohde, "A Novel RFIC for UHF Oscillators (Invited)," 2000 IEEE Radio Frequency Integrated Circuits (RFIC) Symposium, Boston, MA, Jun. 11-13, 2000.

M. Odyniec, Editor, RF and Microwave Oscillator Design, Chapter 3: Linearity, Time Variation, and Oscillator Phase Noise, by T. Lee and A. Hajimiri, Artech House, 2002.

M. Vidmar, "A Wideband, Varactor-Tuned Microstrip VCO," Microwave Journal, Jun. 1999.

H.C. Chang,"Phase noise self-injection-locked oscillators- Theory and experiment," IEEE Transactions on Microwave Theory and Techniques, vol. 51, No. 9, pp. 1994-1999, Sep. 2003.

Franz X. Sinnesbichler, "Hybrid Millimeter-Wave Push-Push Oscillators using Silicon-Germanium HBTs," IEEE MTT-S, vol. 51, Feb. 2003.

U.L. Rohde, D.P. Newkirk, RF/Microwave Circuit Design for Wireless Applications, pp. (123-197; Chapter 5), John Wiley & Sons, Apr. 2000, ISBN 0-471-29818-2.

Douglas R. Jachowski, "Passive Enhancement of Resonator Q in Microwave Notch Filters", IEEE MTT-S Digest, pp. 1315-1318, Jun. 2004.

A. K. Poddar, S.K. Koul, and B. Bhat, "Millimeter Wave Evanescent Mode Gunn Diode Oscillator in Suspended Stripline Configuration." 22nd International Conference on Millimeter Waves, pp. 265-266, Jul. 1997.

Henkes, Dale D, 'Designing Short High Q Resonators', Design, Dec. 2003, pp. 75-109.

Ulrich Rohde, "A New and Efficient Method of Designing Low Noise Microwave Oscillators," PhD Dissertation, Technical University of Berlin, 2004.

Wing Shing Chan et al: "The Design Of Oscillators Using The Cascode Circuit" Circuits and Systems, 1994, vol. 5, pp. 689-692, May 30, 1994.

S. Kudszus, W. H. Haydi, A. Tessmann, W. Bronner, and M. Schlechtweg, "Push-Push Oscillators for 94 and 140 GHz Applications Using Standard Pseudomorphic GaAs HEMTs," IEEE MTT-S, Microwave Symp. Digest, 2001, pp. 1571-1574.

Y. Baeyens et al., "Compact InP-based HBT VCOs with a Wide Tuning Range at W- and D- Band," IEEE Trans. MTT, vol. 48, pp. 2403-2408, Dec. 2001.

Y. Sun, T. Tieman, H. Pflung, and W. Velthius, "A Fully Integrated Dual-Frequency Push-Push VCO for 5.2 and 5.8 GHz Wireless Applications," Microwave Journal., pp. 64-74, Apr. 2001.

M. Schott, H. Kuhnert, J. Hilsenbeck, J. Wurfl, and H. Heinrich, "38 GHz Push-Push GaAs-HBT MMIC Oscillator," IEEE MTT-S, Digest, 2002, pp. 839-842.

F. X. Sinnesbichler and O. R. Olbrich, "SiGe HBT Push-Push Oscillators for V-Band Operation," IEEE MTT-S silicon Monolithic Integrated Circuits in RF Systems Symp., Garmisch, Germany, Apr. 26-28, 2000, pp. 55-59.

F. X. Sinnesbichler, H. Geltinger, and G. R. Olbrich, "A 38-GHz Push-Push Oscillator Based on 25 GHZ πBJT's," IEEE Microwave Guided Wave Lett. vol. 9 pp. 151-153, Apr. 1999.

K. W. Kobayashi et al., "A 108-GHz InP-HBT Monolithic Push-Push VCO with Low Phase Noise and Wide Tuning Bandwidth," IEEE J. Solid-State Circuits, vol. 34, pp. 1225-1232, Sep. 1999.

L. Dussopt, D. Guillois, and O. Rebeiz, "A Low Phase Noise Silicon 9 GHz VCO and an 18 GHz Push-Push Oscillator," IEEE MTT-S. Digest, 2002, pp. 695-698.

F. X. Sinnesbichier, B Hauntz and O. R. Olbrich, "A Si/SiGe HBT Dielectric Resonator Push-Push Oscillator at 58 GHz," IEEE Microwave Guided Wave Lett. vol. 10, pp. 145-147, Apr. 2000.

U. L. Rohde, "A New and Efficient Method of Designing Low Noise Microwave Oscillators," Ph.D. Dissertation, Technical University of Berlin, Feb. 12, 2004.

Mortazawi A and B. C. De Loach, Jr., "Multiple Element Oscillators Utilizing a New Power Combining Technique" in IEEE MTT-S Tnt. Microwave Symp. Dig., 1992, pp. 1093-1096.

B. Van der Pol, "The Nonlinear Theory of Electric Oscillations," Proc. IRE, vol. 22 No. 9, pp. 1051-1086, Sep. 1934.

R. Adler, "A Study of Locking Phenomena in Oscillators," Proc. IEEE, vol. 61, pp. 180-1385, Oct. 1973.

D. B. Leeson, "A Simple Model of Feedback Oscillator Noise Spectrum," Proc. IEEE, pp. 329-332, 1966.

Heng-Chia Chang, Xudong Cao, Umesh K. Mishra, and R. York, "Phase Noise in Coupled Oscillators: Theory and Experiment," IEEE Trans. MTT, vol. 45, pp. 604-615, May 1997.

Heng-Chia Chang, Xudong Cao, Mark J. Vaughan, Umesh K. Mishra, and R. York, "Phase Noise in Externally injection-Locked Oscillator Arrays," IEEE Trans. MTT, vol. 45, pp. 2035-2042, Nov. 1997.

Andrea Borgioli, Pochi Yeh and Robert A. York, "Analysis of Oscillators with External Feedback Loop for Improved Locking Range and Noise Reduction," IEEE Trans. MTT, vol. 47, pp. 1535-1543, Aug. 1999.

Jonathan J. Lynch and Robert A. York, "Synchronization of Oscillators Coupled Through Narrow-Band Networks," IEEE Trans. MTT, pp. 238-249, Feb. 2001.

Klaus F. Schunemann and Karl Behm, "Nonlinear Noise Theory for Synchronized Oscillators," IEEE Trans. MTT, vol. 27, pp. 452-458, May 1979.

Kaneyuki Kurokawa, "The Single-Cavity Multiple-Device Oscillator," IEEE Trans. MTT, vol. 19, pp. 793-801, Oct. 1971.

Kaneyuki Kurokawa, "Noise in Synchronized Oscillators," IEEE Trans. MTT, vol. 16, pp. 234-240, Apr. 1968.

Byeong-Ha Park, "A Low-Voltage, Low-Power, CMOS 900 MHz Frequency Synthesizer," Ph.D. Dissertation, Georgia Institute of Technology, Dec. 1997.

W. O. Schlosser, "Noise in Mutually Synchronized Oscillators," IEEE Trans. Microwave Theory Tech., vol. MTT-16, pp. 732-737, Sep. 1968.

Heng-Chia Chang, "Analysis of Coupled Phase-Locked Loops With Independent Oscillators for Beam Control Active Phased Arrays" IEEE Trans. MTT, vol. 52, pp. 1059-1065, Mar. 2004.

Reidar L. Kuvas, "Noise in Single-Frequency Oscillators and Amplifiers," IEEE Trans. Microwave Theory Tech., vol. MTT-21, pp. 127-134, Mar. 1973.

H. Stark, and J. W. Woods, "Probability, Random Processes, and Estimation Theory for Engineers". New York: Prentice-Hall, 1986.

R. A. York, P. Liao, and J. J. Lynch, "Oscillator Array Dynamics with Broad-Band N-Port Coupling Networks," IEEE Trans. Microwave Theory Tech., vol. 42, pp. 2040-2045, Nov. 1994.

R. A. York, "Nonlinear Analysis of Phase Relationships in Quasi-Optical Oscillator Arrays," IEEE Trans. Microwave Theory Tech., vol. 41, pp. 1799-1809, Oct. 1993.

Shih-Chieh Yen and Tah-Hsiung Chu, "An Nth-Harmonic Oscillator Using an N-Push Coupled Oscillator Array with Voltage-Clamping Circuits", IEEE, MTT-S Digest, pp. 545-548, 1992.

J. R. Bender, C. Wong, "Push-Push Design Extends Bipolar Frequency Range," Microwave & RF, pp. 91-98, Oct. 1983.

Franco Ramirez, Jose Lius Garcia H., Tomas Fernandez and Almudena Suarez,"Nonlinear Simulation Techniques for the Optimized Design of Push-Push Oscillators", IEEE, MTT-S Digest, pp. 2157-2160, 2003.

Jeong-Geun Kim, Dong-Hyun Baek, Sang-Hoon Jeon, Jae-Woo Park and Songcheol Hong, "A 60 GHz InGaP/GaAs HBT Push-Push MMIC VCO," IEEE, MTT-S Digest, pp. 885-888, 2003.

F. X. Sinnesbichler, B. Hautz, G. R. Olbrich, "A Low Phase Noise 58 GHz SiGe HBT Push-Push, Oscillator with Simultaneous 29 GHz Output", IEEE, MTT-S Digest, pp. 35-38, 2000.

Hai Xiao, Takayuki Tanka and Masayoshi Aikawa, "A Ka-Band Quadruple-Push Oscillator", IEEE, MTT-S Digest, pp. 889-892, 2003.

R. G. Freitag, S.H. Lee, D.M. Krafcsik, D.E. Dawson and J. E. Degenford, "Stability and Improved Circuit Modeling Considerations for High Power MMIC Amplifiers", IEEE, MM-Wave Monolithic Circuits Symposium, pp. 2169-2172, 2003.

J. Heinbockel and A. Mortazawi, "A Periodic Spatial Power Combining MESFET Oscillator", IEEE, MTT-S Digest, pp. 545-548, 1992.

M. Kuramitsu and F. Takasi, "Analytical Method for Multimode Oscillators Using the Averaged Potential," Elec. Communication Japan, vol. 66-A, pp. 10-19, 1983.

Ronald G. Freitag, "A Unified Analysis of MMIC Power Amplifier Stability," IEEE, MTT-S Digest, pp. 297-300, 1992.

Shigeji Nogi, Jenshan Lin and Tatsuo Itoh., "Mode Analysis and Stabilization of a Spatial Power Combining Array with Strongly Coupled Oscillators," IEEE, MTT, vol. 41, pp. 1827-1837, Oct. 1993.

Amir Mortazawi, Heinrich D. Foltz, and Tatsuo Itoh, "A Periodic Second Harmonic Spatial Power Combining Oscillator", IEEE, MTT, vol. 40, pp. 851-856, May 1992.

Jonathan J. Lynch and Robert A. York,"An Analysis of Mode-Locked Arrays of Automatic Level Control Oscillators," IEEE Trans. on Circuits and Systems-1, vol. 41, pp. 859-865, Dec. 1994.

R. A. York and R.C. Compton, "Mode-Locked Oscillator Arrays", IEEE Microwave and Guided Letter, vol. 1, pp. 215-218, Aug. 1991.

Yu-Lung Tang and Huei Wang, "Triple-Push Oscillator Approach: Theory and Experiments," IEEE- JSS, vol. 36, pp. 1472-1479, Oct. 2001.

J. Everard, "Fundamentals of RF Circuit Design with Low Noise Oscillators," John Wiley & Sons, Ltd, 2001.

U.L. Rohde, "Improved Noise Modeling of GaAs FETS: Using an Enhanced Equivalent Circuit Technique," Microwave Journal, pp. 87-101—Nov. 1991.

WA. Pucel, W. Struble, R Hallgren, U.L. Rohde, "A General Noise De-embedding Procedure for Packaged Two-Port Linear Active Devices," IEEE Transactions on MTT, vol. 40, No. 11, pp. 2013-2024, Nov. 1992.

U.L. Rohde, "Parameter Extraction for Large Signal Noise Models and Simulation of Noise in Large Signal Circuits Like Mixers and Oscillators," 23rd European Microwave Conference, Madrid, Spain, Sep. 6-9, 1993.

C. Arnaud, D. Basataud, J. Nebus, J. Teyssier, J. Villotte, D. Floriot, "An Active Pulsed RF and Pulsed DC Load-Pull System for the Characterization of HBT Power Amplifiers Used in Coherent Radar and Communication Systems," IEEE Transactions on Mfl, vol. 48, No. 12, pp. 2625-2629, Dec. 2000.

F.M. Ghannouchi, R. Larose, R.G. Bosisio, "A New Multiharmonic Loading Method for Large-Signal Microwave and Millimeter-Wave Transistor Characterization," IEEE Transactions on MTT, vol. 39, No. 6, pp. 986-992, Jun. 1991.

H. Abe, Y. Aono, "11-GHz GaAs Power MESFET Load-Pull Measurements Utilizing a New Method of Determining Turner Y Parameters," IEEE Transactions on Microwave Theory and Techniques, vol. 27, No. 5, pp. 394-399, May 1979.

Q. Cai, J. Gerber, S. Peng, "A Systematic Scheme for Power Amplifier Design Using a Multi-Harmonic Loadpull Simulation Technique," 1998 IEEE MTT-S Symposium Digest, vol. 1, pp. 161-165, Jun. 7-12, 1998.

P. Berini, M. Desgagne, F.M. Ghannouchi, R.G. Bosisio, "An Experimental Study of the Effects of Harmonic Loading on Microwave MESFET Oscillators and Amplifiers," IEEE Transactions on MTT, vol. 42, No. 6, pp. 943-950, Jun. 1994.

A. M. Elsayed and M. I. Elmasry, "Low-Phase-Noise LC Quadrature VCO using Coupled Tank Resonators in a Ring Structure," IEEE, JSSC, vol. 36, pp. 701-705, Apr. 2001.

M. Ticbout, "Low power, Low Phase Noise, Differentially Tuned Quadrature VCO Design in Standard CMOS," IEEE- JSSS, vol. 36, pp. 10 18-1024, Jul. 2001.

K.O, "Estimation Methods for Quality Factors of Inductors Fabricated in Silicon Integrated Circuit Process Technologies," IEEE, JSSS, pp. 1565-1567, Sep. 1997.

A.V. Grebennikov, "Microwave Transistor Oscillators: an Analytic Approach to Simplify Computer-Aided Design", Microwave Journal, pp. 294-299, May 1999.

Andrew V. Grebennikov, "Microwave FET Oscillators: an Analytic Approach to Simplify Computer-Aided Design", Microwave journal, pp. 102-111, Jan. 2000.

Jwo-Shiun Sun, "Design Analysis of Microwave Varactor-Tuned Oscillators", Microwave journal, pp. 302-308, May 1999.

M. Regis, O. Llopis, and J. Graffeuil, "Nonlinear Modeling and Design of Bipolar Transistor Ultra-Low Phase-Noise Dielectric-Resonator Oscillators", IEEE transaction on MTT, vol. 46, No. 10, pp. 1589-1593, Oct. 1998.

R. J. Hawkins, "Limitations of Nielsen's and Related Noise Equations Applied to Microwave Bipolar Transistors and a New Expression for the Frequency and Current Dependent Noise Figure," Solid-State Electron., vol.20 pp. 191-196, 1977.

T. H. Hsu and C.P. Snapp, "Low-Noise Microwave Bipolar Transistor with Sub-Half-Micrometer Emitter Width," IEEE Trans. Electron Devices, vol. ED-25, pp. 723-730, Jun. 1978.

U. L. Rohde, K. Juergen Schoepf, A.K. Poddar, "Low-Noise VCOs Conquer Wide Bands," Microwaves & RF, pp. 98-106, Jun. 2004.

A. K. Poddar and K. N. Pandey, "Microwave Switch using MEMS-technology," 8th IEEE International Symposium, EDMO-2000, pp. 134-139, Nov. 2000, UK.

A. Ward and B. Ward, "A Comparison of various Bipolar Transistor Biasing Circuits," Applied Microwave & Wireless, vol. 13, pp. 30-52, 2001.

U. L. Rohde, A. K. Poddar, Juergen Schoepf, Reimund Rebel, and Parimal Patel, "Low Noise Low Cost Wideband N-Push VCO," IEEE, IMS Symposium, MTT2005, USA.

* cited by examiner

SLOT-CUT-MICROSTRIP-LINE-PRINTED-BOARD

LOW THERMAL DRIFT, TUNABLE FREQUENCY VOLTAGE CONTROLLED OSCILLATOR

CROSS-REFERENCE TO RELATED APPLICATIONS

This application is a continuation-in-part of U.S. patent application Ser. No. 11/007,861, filed Dec. 9, 2004, which claims the benefit of the filing date of U.S. Provisional Patent Application Nos. 60/527,957, filed Dec. 9, 2003; 60/528,670, filed Dec. 11, 2003; and 60/563,481, filed Apr. 19, 2004, the disclosures of which are hereby incorporated herein by reference. This application also claims the benefit of the filing date of U.S. Provisional Patent Application Nos. 60/589,090, filed Jul. 19, 2004, and 60/601,823 filed Aug. 16, 2004, the disclosures of which are hereby incorporated herein by reference.

BACKGROUND OF THE INVENTION

A voltage controlled oscillator (VCO) or oscillator is a component that can be used to translate DC voltage into a radio frequency (RF) voltage or signal. The magnitude of the output signal is dependent on the design of the VCO circuit and the frequency of operation is determined, in part, by a resonator that provides an input signal. In general, VCOs are designed to produce an oscillating signal at a particular frequency 'f' that corresponds to a given tuning voltage. In particular, the frequency of the oscillating signal is dependent upon the magnitude of a tuning voltage $V_{tune}$ applied to a tuning diode network across a resonator circuit. The frequency 'f' may be varied from $f_{min}$ to $f_{max}$ and these limits are referred as the tuning range or bandwidth of the VCO. The tuning sensitivity of the VCO is defined as the change in frequency over the tuning voltage and it is desirable to tune the VCO over a wide frequency range within a small tuning voltage range.

Clock generation and clock recovery circuits typically use VCOs within a phase locked loop (PLL) to either generate a clock from an external reference or from an incoming data stream. VCOs affect the performance of PLLs. In addition, PLLs are typically considered essential components in communication networking as the generated clock signal is typically used to either transmit or recover the underlying service information so that the information can be used for its intended purpose. PLLs are also important in wireless networks as they enable the communications equipment to quickly lock onto the carrier frequency on which communications are transmitted.

The popularity of mobile telephones has renewed interest in and generated more attention in wireless architectures. This popularity has further spawned renewed interest in the design of low noise wideband oscillators. In that regard, most mobile communication systems include a tunable VCO as a component in a frequency synthesizer, which selectively provides a choice of the desired channel. The recent explosive growth in the new families of cellular telephones and base stations using universal mobile telephone systems (UMTS) has stirred a need for developing an ultra-low noise oscillator with a fairly wide tuning range. The demands of wideband sources have generally increased telescopically because of the explosive growth of wireless communications. In particular, modern communication systems are typically multi-band and multi-mode, therefore requiring a wideband low noise source that preferably allows simultaneous access to DCS 1800, PCS 1900 and WCDMA (wideband code division multiple access) networks. The commercial handsets employed by these and other next generation networks are typically required to be capable of handling not only voice data, but also image and video data. Therefore, the radio link typically has to deal with signals that are more digitally complex.

The dynamic operating range and noise performance of a VCO may limit or affect the performance of the PLL itself, which in turn may affect the performance of the device in which the PLL is employed, e.g., RF transceivers, a cell phone, a modem card, etc. Broadband tunability of VCOs represents one of the more fundamental tradeoffs in the design of a VCO, impacting both the technology and the topology used. The dynamic time average quality factor (i.e., Q-factor) of the resonator as well as the tuning diode noise contribution affect the noise performance of a VCO. Furthermore, the dynamic loaded Q is, in general, inversely proportional to the operating frequency range of the VCO.

Despite the continuous improvement in VCO technology, low phase noise typically remains a bottleneck and poses a challenge to RF transceiver (transmitter—receivers) design. In addition, oscillator/VCO design typically poses a challenge to the RF trans-receiver system. This is typically considered due to the more demanding parameters of the VCO design: low phase noise, low power consumption and wide frequency tuning range. For example, in a receiver, the phase noise of the local oscillator limits the ability to detect a weak signal in the presence of a strong signal in an adjacent channel. In a transmitter, phase noise results in energy being transmitted outside the desired channel or band.

Improvements in oscillator/VCO technology have continued with time, yielding ever-smaller sources with enhanced phase noise and tuning linearity but the phenomena of the thermal drift over the temperature range (−40° C. to +85° C.) has not been properly addressed. The wide operating temperature range of the oscillator/VCOs coupled with a general lack of information on the thermal drift-profile creates a need for the development of a uniform and user-definable thermal drift profile oscillator with a relatively low thermal drift over the wide operating temperature range and operating frequency band.

Usually, high-stability oscillators are built with a quartz crystal up to frequencies of several hundred megahertz. However, in order to achieve better overall performance, the SAW (surface acoustic wave) resonator based oscillator is generally considered a better choice for an ultra low phase noise low thermal drift oscillator. In that regard, SAW resonator based oscillators are widely used in wireless applications, since that technology generally features relatively low phase noise at fixed frequencies, low microphone noise (tolerance to vibration), high Q and low jitter.

On the other hand, SAW resonators are typically used in oscillators as a two-port resonator and have a relatively small pull-in range that usually does not support a wide enough tuning range to compensate for tolerances due to the circuit components. This typically limits the amount of correction that can be made to compensate for the tolerances of the circuit components and thermal drift over the operating temperature range (−40° C. to +85° C.). In addition, SAW devices are comparatively expensive compared to CROs (ceramic resonator based oscillator) and their availability and performance are limited to a select frequency and a relatively narrow operating temperature range (−20° C. to +70° C.). This generally makes them unsuitable for operating in stringent temperature environments and/or low cost applications.

Thus, there is a need for a low noise, low thermal drift oscillator that is operable over a wide temperature range and which offers a cost-effective solution to the demand for a low noise tunable oscillator.

SUMMARY OF THE INVENTION

An aspect of the present invention is an oscillator. The oscillator preferably includes a cascode configured device having first, second and third terminals and a plurality of resonators. The oscillator further preferably comprises first circuitry coupled between the plurality of resonators and the second terminal of the cascode configured device, the circuitry being operable as an evanescent mode buffer to compensate for changes in the capacitance of the oscillator during operation.

Further in accordance with this aspect of the present invention, the first circuitry preferably comprises a slot-cut microstripline printed circuit board.

Further in accordance with this aspect of the present invention, the oscillator may further comprise second circuitry coupled across the third terminal of the active device and the first circuitry, the second circuitry being operable to track the conduction angle of the cascode configured device.

It is further desirable that the first circuitry is operable to select an operating frequency associated with the oscillator.

Further still in accordance with this aspect of the present invention, the cascode configured device preferably comprises first and second transistors connected in a common collector common emitter configuration. Most preferably, the transistors comprise bipolar transistors, but may also comprise field effect transistors.

Further in accordance with this aspect of the present invention, the oscillator may further desirably comprise a filter coupled between the third terminal of the cascode configured device and the first circuitry and operable to degeneratively filter and feedback a select amount of phase noise from the cascode configured device to the first circuitry.

Most preferably, the resonators of the oscillator comprise ceramic resonators.

In another aspect, the present invention is a voltage controlled oscillator. The voltage controlled oscillator preferably comprises a cascode configured device having first, second and third terminals; and a pair of coupled resonators including slot-cut-microstripline circuitry connected to the second terminal of the cascode configured device, the slot-cut-microstripline circuitry operating as a coupling capacitor between the resonators and the cascode configured device.

Further in accordance with this aspect of the present invention, a capacitance value associated with the slot-cut-microstripline circuitry is electronically tunable.

Further still in accordance with this aspect of the present invention, the oscillator may further comprise circuitry coupled across the third terminal of the cascode configured device and the slot-cut-microstripline circuitry and operable to track the conduction angle of the cascode configured device. In addition, the oscillator may also desirably comprise a tuning network for dynamically tuning the operating or oscillating frequency of the oscillator.

Further still in accordance with this aspect of the present invention, the slot-cut-microstripline circuitry can be dynamically tuned in response to adjustments of the tuning network.

In accordance with this aspect of the present invention, the voltage controlled oscillator may further desirably comprise circuitry coupled across the third terminal of the cascode configured device and the slot-cut-microstripline circuitry and operable to track the conduction angle of the cascode configured device in response to adjustments of the tuning network. In addition, the voltage-controlled oscillator may also include a dynamically tunable filter coupled across the third terminal of the cascode configured device and the slot-cut-microstripline circuitry and operable to degeneratively filter and feedback a select amount of phase noise from the cascode configured device to slot-cut-microstripline circuitry in response to adjustments of the tuning network.

Most preferably in accordance with this aspect of the present invention, the cascode configured device comprises first and second transistors connected in a common collector common emitter configuration.

In yet another aspect of the present invention, a voltage controlled oscillator is provided. The oscillator preferably comprises a cascode configured device having first, second and third terminals and comprising a pair of transistors arranged in a common collector and emitter configuration; a voltage tuning network; and a dynamically tuned coupled resonator including a slot-cut-mincrostripline printed circuit board connected to the second terminal of the cascode configured device and operable to select an operating frequency of the oscillator in response to a voltage adjustment associated with the voltage tuning network.

In yet another aspect of the present invention, an apparatus is provided. The apparatus preferably comprises a phase lock loop for generating a clock signal used to transmit or recover information communicated from or to the apparatus, the phase lock loop comprising a voltage a-controlled oscillator for generating the clock signal, the voltage controlled oscillator comprising: a cascode configured device having first, second and third terminals; a plurality of resonators; and first circuitry coupled between the plurality of resonators and the second terminal of the cascode configured device, the circuitry being operable as a evanescent mode buffer to compensate for changes in the capacitance of the oscillator during operation.

The apparatus may comprise a wireless device such as cellular telephone, a radio frequency transmitter or receiver, a modem or a personal digital assistant.

DETAILED DESCRIPTION

Figure 1A:
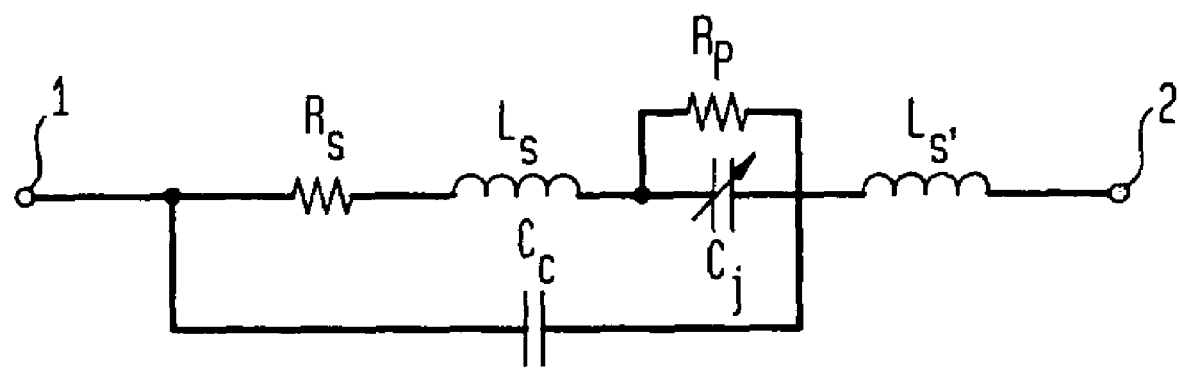
FIGS. 1A and 1B depict circuits of a tuning diode in accordance with an aspect of the present invention.
Figure 1B:
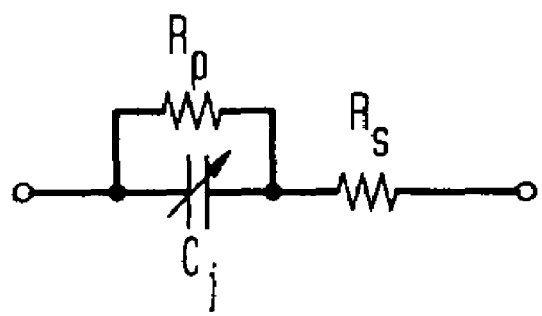

FIGS. 1A and 1B depict circuits that illustrate a tuning diode using resistors, capacitors and inductors. As shown in FIG. 1A, a tuning diode may be depicted as a two-port device (as shown, ports 1 and 2) having a resistor $R_s$ connected to port 1 and in series with an inductor $L_s$. $R_s$ and $L_s$ are connected in series to resistor $R_p$ and a variable capacitor $C_j$, which are in parallel with each other. $C_j$ reflects the junction capacitance of the tuning diode and is variable in response to temperature changes. The circuit further includes a capacitor $C_c$ in parallel with $R_s$, $L_s$ and $C_j$ between ports 1 and 2 and an inductor $L_s$, between port 2, $C_j$, $C_c$ and $R_p$, as shown.

FIG. 1B shows a simplified equivalent circuit of a tuning diode and includes resistor $R_p$ in parallel with capacitor $C_c$. The capacitor $C_c$ is also in series with resistor $R_s$.

With reference to FIGS. 1A and 1B, the expression for the junction capacitance of the tuning diode under a reverse bias condition is given by:

$$C_j(\varepsilon_r, d_j, A, V) = \frac{dQ}{dV} = \frac{\varepsilon_0 \varepsilon_r(T) A}{d_j} = \left[ \frac{\varepsilon_0 \varepsilon_r A}{\frac{[2K_s \varepsilon_o (V_{bi} - V_A)}{q} \frac{(N_A + N_D)]^{1/2}}{N_A N_D}} \right]$$

Under the abrupt junction assumption, the depletion region thickness, $d_j$, is given by:

$$d_j = \left[ \frac{[2K_s \varepsilon_o (V_{bi} - V_A)}{q} \frac{(N_A + N_D)]^{1/2}}{N_A N_D} \right]$$

Where, $N_D$ and $N_A$ are the donor and acceptor volume densities. $V_{bi}$ is the built-in potential and is given by:

$$V_{bi} = \left[ \frac{kT}{q} \right] \ln \left[ \frac{N_A N_D}{n_i^2} \right]$$

Under reverse bias conditions, the spacing $d_j$ is a function of the applied voltage $V_A < 0$ and this effect is used to produce a variable capacitor. The equivalent capacitance of a junction per unit area is given as:

$$c(q, B, \varepsilon) = \frac{C_j(\varepsilon_r, d_j, A)}{A} = \varepsilon_0 \varepsilon_r(T) \frac{dE}{dV} = \left[ \frac{qB\varepsilon^{(m+1)}}{(m+2)(V+\phi)} \right]^{1/(m+2)}$$

$$c(q, B, \varepsilon) = \frac{\varepsilon_0 \varepsilon_r}{\frac{[2K_s \varepsilon_o (V_{bi} - V_A)}{q} \frac{(N_A + N_D)]^{1/2}}{N_A N_D}}$$

$$Q = \varepsilon_0 \varepsilon_r(T) E$$

Where,
Q=Charge per unit area
$\varepsilon = \varepsilon_0 \varepsilon_r$, $\varepsilon_r$=Dielectric constant
A=Device cross sectional area
d=Depletion layer width
c=Capacitance per unit area
m=Impurity exponent
q=Charge
B=Magnetic field
T=Temperature
V=Reverse voltage applied across the diode
E=Electric field Combining all the constants terms together, including the area of the diode, into the constant, $C_d$, the expression for capacitance is given as:

$$C_j(\varepsilon_r, d_j, A, V) = \frac{C_d}{(V+\phi)^\gamma}$$

$$C_d = C_0(\phi)^\gamma$$

$$C = C_c + C_j(\varepsilon_r, d_j, A, V)$$

Where,
γ=Capacitance exponent and depends on the doping geometry of the diode. Its value varies from ⅓ to 2 for Si (silica) diode. The value of γ for an abrupt junction diode is ½, but such diodes have a limited tuning ratio. For wideband tunability, a hyper abrupt junction diode is preferred, and value of γ is 1 or 2.
φ=The junction contact potential (0.7V for Si (silica))
$C_0$=Value of capacitance at zero voltage
$C_c$=Case capacitance
$C_j$=Junction capacitance The tuning ratio (TR) is given by $$TR = \frac{C_j(V_2 = V_{\min})}{C_j(V_1 = V_{\max})} = \left[ \frac{(V_1 + \phi)}{(V_2 + \phi)} \right]^\gamma$$

The oscillator frequency varies proportionally to $1/\sqrt{C}$ and for the linear tuning range junction capacitance should vary as $1/V^2$ (γ=2). The frequency ratio is given as the square root of the tuning ratio TR The Q of the tuning diode is a function of the reverse bias voltage, frequency and temperature. The expression for the Q of the tuning diode is given by:

$$Q = 2\pi \left[ \frac{\text{Stored} - \text{Energy}}{\text{Dissipated} - \text{energy}} \right] = \frac{\omega C R_p^2}{R_p + R_s + \omega^2 C^2 R_s R_p^2}$$

-continued $$C = [C_c + C_j(\varepsilon_r, d_j, A, V)] = C_c + \frac{C_d}{(V+\phi)^\gamma}$$

The Q of the tuning diode falls off at high frequency due to the series bulk-resistance $R_s$ and can be expressed as $$[Q]_{High-frequency} = \left[\frac{\omega CR_p^2}{R_p + R + \omega^2 C^2 R_s R_p^2}\right]_{\omega\gg} \approx \left[\frac{\omega CR_p^2}{\omega^2 C^2 R_s R_p^2}\right] \Rightarrow \left[\frac{1}{\omega CR_s}\right]$$

$$[Q]_{High-frequency} \propto \frac{1}{R_s}$$

The Q of the tuning diode falls off at low frequencies due to the back resistance of the reverse-biased diode $R_p$ and can be expressed as:

$$[Q]_{Low-frequency} = \left[\frac{\omega CR_p^2}{R_p + R_s + \omega^2 C^2 RR_p^2}\right]_{\omega\ll} \approx \left[\frac{\omega CR_p^2}{R_p + R_s}\right] \Rightarrow \omega CR_p$$

$$[Q]_{Low-frequency} \propto R_P$$

Where
$R_p$=Parallel resistance or back resistance of the diode
$R_s$=Bulk resistance of the diode-device material
$L_s$=Internal lead inductance
$L_{s'}$=External lead inductance
$C_c$=Case capacitance As the junction-temperature increases, the leakage current increases and it lowers the back resistance $R_p$ of the diode. The increase in the junction temperature causes a slight decrease in $R_s$, but the effects of the decreasing $R_p$ are greater and this forces the effective Q to decrease.

The change in the value of the capacitance of the tuning diode with respect to temperature causes frequency drifts of the oscillator/VCOs circuit. The change in the value of the capacitance with temperature can be given by:

$$C \propto [T]^{T_{cc}}$$

$$C(V) = \frac{C(0)}{(V+\phi)^\gamma}$$

$$\frac{dC(V)}{dT} = \frac{\gamma C(0)}{(V+\phi)^{(\gamma+1)}} \frac{d\phi}{dT}$$

$$T_{CC} = \left[\frac{1}{C(V)}\right]\left[\frac{dC(V)}{dT}\right] = -\left[\frac{\gamma}{(V+\phi)}\right]\left[\frac{d\phi}{dT}\right]$$

$$\frac{d\phi}{dT} \approx -2.3(\text{mV}/^\circ C), \text{ for Si (silica)}$$

Where $T_{cc}$ is a temperature coefficient.

From above, the temperature coefficient $T_{cc}$ is inversely proportional to the applied voltage and directly proportional to the diode slope $\gamma$. In addition, tuning diode capacitance increases with an increase in temperature, whereas capacitance drift decreases with an increase in reverse bias voltage, i.e., at a higher reverse voltage drift is at a minimum as compared to at a low reverse voltage. The capacitance constant $C_d$ is a function of the geometric dimension and varies with the dielectric constant, which is also a function of temperature.

The net thermal drift of an oscillator/VCO is generally due to the tuning diode, active device, resonator and passive components in the oscillator circuitry. The approach of adding a negative temperature coefficient compensating capacitor typically does not compensate for the tuning diode temperature coefficient $T_{cc}$ because the change in the capacitance is not constant, but instead varies with the applied reverse bias voltage across the tuning diode over the temperature. The general approach of nullifying the temperature dependency of the tuning diode's built in contact potential $\phi$ by adding a forward bias diode or transistor-emitter-follower in series with the tuning voltage of the tuning diode network comes at the cost of higher phase noise and non-uniform thermal drift over the temperature range.

In accordance with an aspect of the present invention, the thermal drift is compensated for by introducing a common coupling-capacitor between a resonator, an active device and a tuning diode network of an oscillator. The coupling capacitor may comprise a slot-cut-microstripline or any other variable capacitive storage element. The slot-cut-microstripline controls the profile of the thermal drift and also acts as an evanescent-mode-buffer between the resonator and the active device, so that the time average dynamic loaded Q of the resonator is enhanced and provides low noise performance over the operating frequency band of the oscillator.

Figure 2:
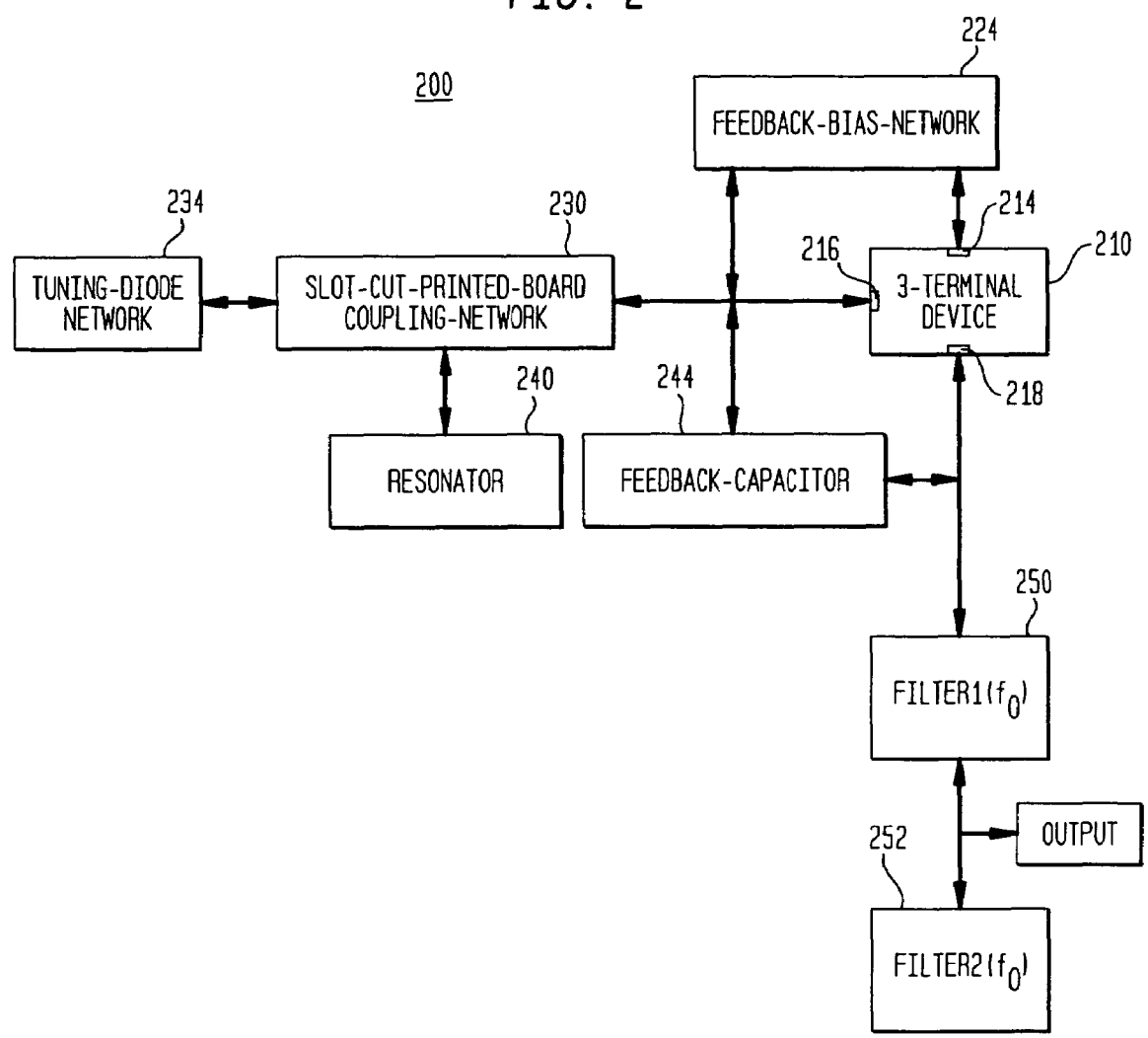
FIG. 2 depicts a schematic of an oscillator in accordance with an aspect of the present invention.

In particular, FIG. 2 shows an oscillator 200 in accordance with an aspect of the present invention. The oscillator includes a three-terminal device 210 having a first terminal 214, a second terminal 216 and a third terminal 218. The three-terminal device may comprise any three-terminal device that can provide a 180° phase shift between any two terminals and preferably includes a bipolar or field effect transistor. A feedback-bias network 224 is connected between the first and second terminals, 214, 216, respectively. A slot-cut-printed-board-coupling network 230 is coupled to the second terminal and to a tuning diode network 234. The slot-cut-printed-board-coupling network 230 is also coupled to a resonator 240. In addition, the oscillator 200 includes a feedback capacitor 244 between the second and third terminals, 216, 218, respectively, and a pair of filters, 250, 252 coupled in series to the third terminal 218. An output signal is taken between first filter 250 and second filter 252.

In accordance with this aspect of the present invention, the slot-cut-printed-board-coupling network 230 compensates for capacitance changes in the tuning-diode network 234 due to changes in operating temperature of the environment or the oscillator 200. In addition, and as discussed in further detail below, the slot-cut-printed-board-coupling network 230 may be implemented so as to define the thermal drift profile of the oscillator, i.e., the change in output frequency due to change in operating temperature. The physical dimensions of the slot-cut-printed-board may be chosen to define a particular thermal profile, e.g., see FIGS. 5–8. The slot-cut-printed-board-coupling network 230 also acts as an evanescent mode buffer between the resonator 240 and the three terminal device 210 by storing additional energy that may develop in the oscillator as the temperature changes. The additional energy is then typically released without increasing the phase noise of the output signal. In particular, the network 230 provides a storage element, e.g., a capacitor, that generally operates to store excess energy that may develop in the circuit due to temperature changes and releasing such energy so that phase noise performance of the oscillator is controlled during the temperature changes. For example, if the bias voltage increases due to a change in temperature, the capacitor assists in lowering the bias voltage to or near the optimal operating point.

Figure 3:
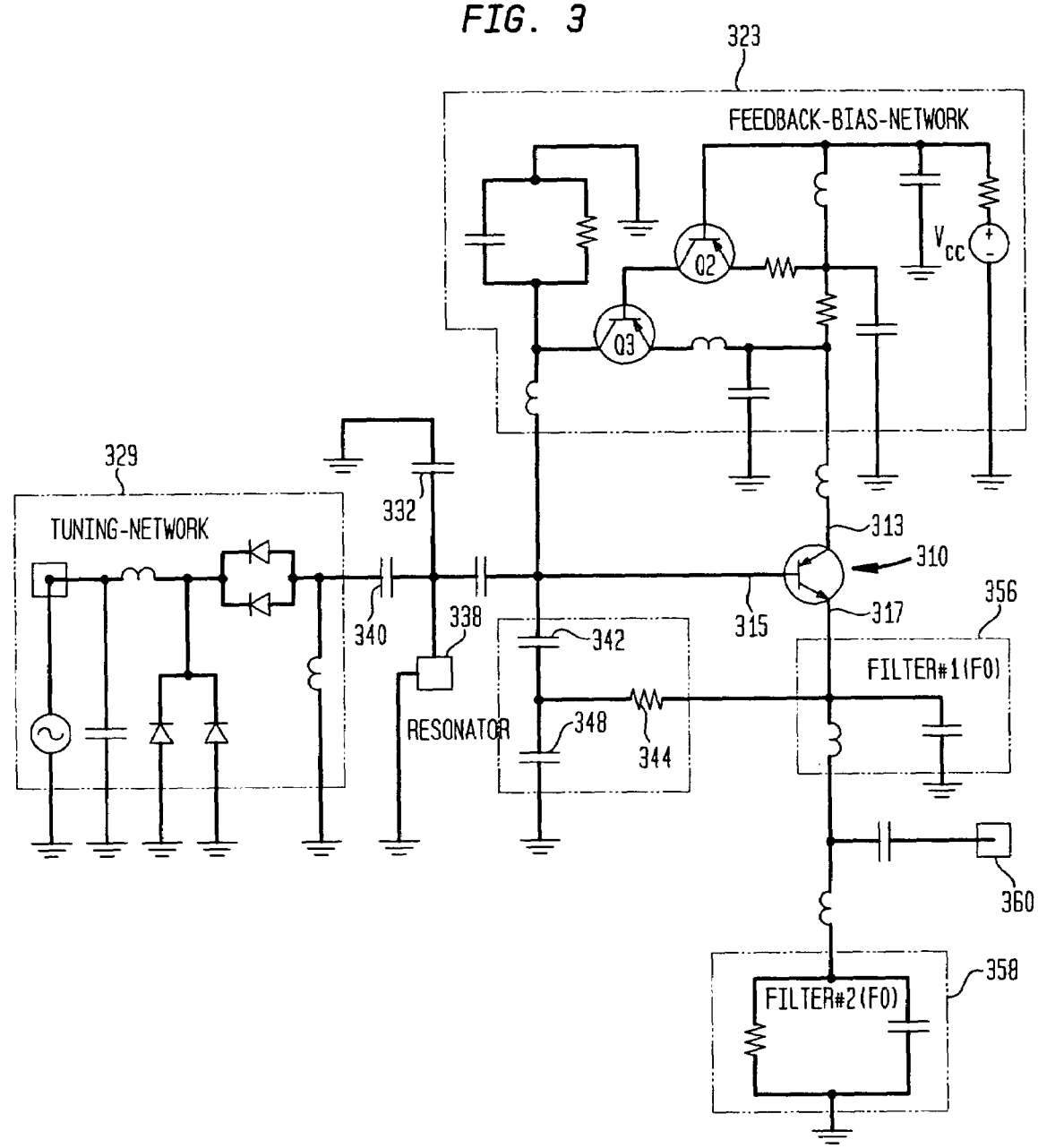
FIG. 3 depicts a schematic of an oscillator in accordance with an aspect of the present invention.

Turning now to FIG. 3, there is illustrated a oscillator 300 in accordance with an aspect of the present invention. The oscillator includes an active device 310 having three terminals, 313, 315, 317. The active device 310 may comprise a bipolar transistor or field effect transistor wherein the first, second and third terminals 313, 315, 317 comprise, respectively, the collector, base and emitter nodes of the transistor. In general, the active device 310 may comprise any device that can provide a 180° phase shift between the first terminal 313 and second terminal 315.

The first terminal 313 is connected to a feedback-bias network 323. The network 323 includes a voltage source Vcc coupled to the first terminal 313 that is used for biasing the active device 310 by providing a predetermined voltage at the first terminal 313. The network 323 also includes a pair of transistors Q2, Q3 (which are illustrated as bipolar transistors, but may also be field effect transistors) and associated circuit elements such as capacitors, resistors and inductors that couple a selected amount of the signal from the first terminal 313 to the second terminal 315.

The second terminal 315 is also capacitively coupled to tuning network 329, slot-cut-printed-board-coupling capacitor 332 and a resonator 338. As shown, the tuning network 329, slot-cut-printed-board-coupling capacitor 332 and resonator 338 are coupled in parallel. In addition, the tuning network 329 is capacitively coupled via coupling capacitor 340. The slot-cut-printed-board-coupling capacitor 332 compensates for changes in the capacitance, which are in turn caused by the changes in the junction contact potential, e.g., $d\phi/dT$, of the tuning network 329 as a result of changes in the operating temperature of oscillator 300 or the environment.

The oscillator 300 further includes a feedback capacitor 342 that is coupled to the third terminal 317 through a resistor 344 and to ground through capacitor 348. Capacitor 342, resistor 344 and capacitor 348 together form a network that feeds back a select portion of the signal from the third terminal 317 to the second terminal 315. The oscillator 300 also includes a pair of filters 356, 358 coupled to the third terminal 317 that provide two-stage regenerative filtering. An output signal is capacitively coupled to output port 360 between the filters 356, 358. As shown, filter 356 preferably comprises an LC filter and filter 358 preferably comprises an RC filter. The time constants of these filters are preferably adjusted to the fundamental frequency of operation.

Figure 4:
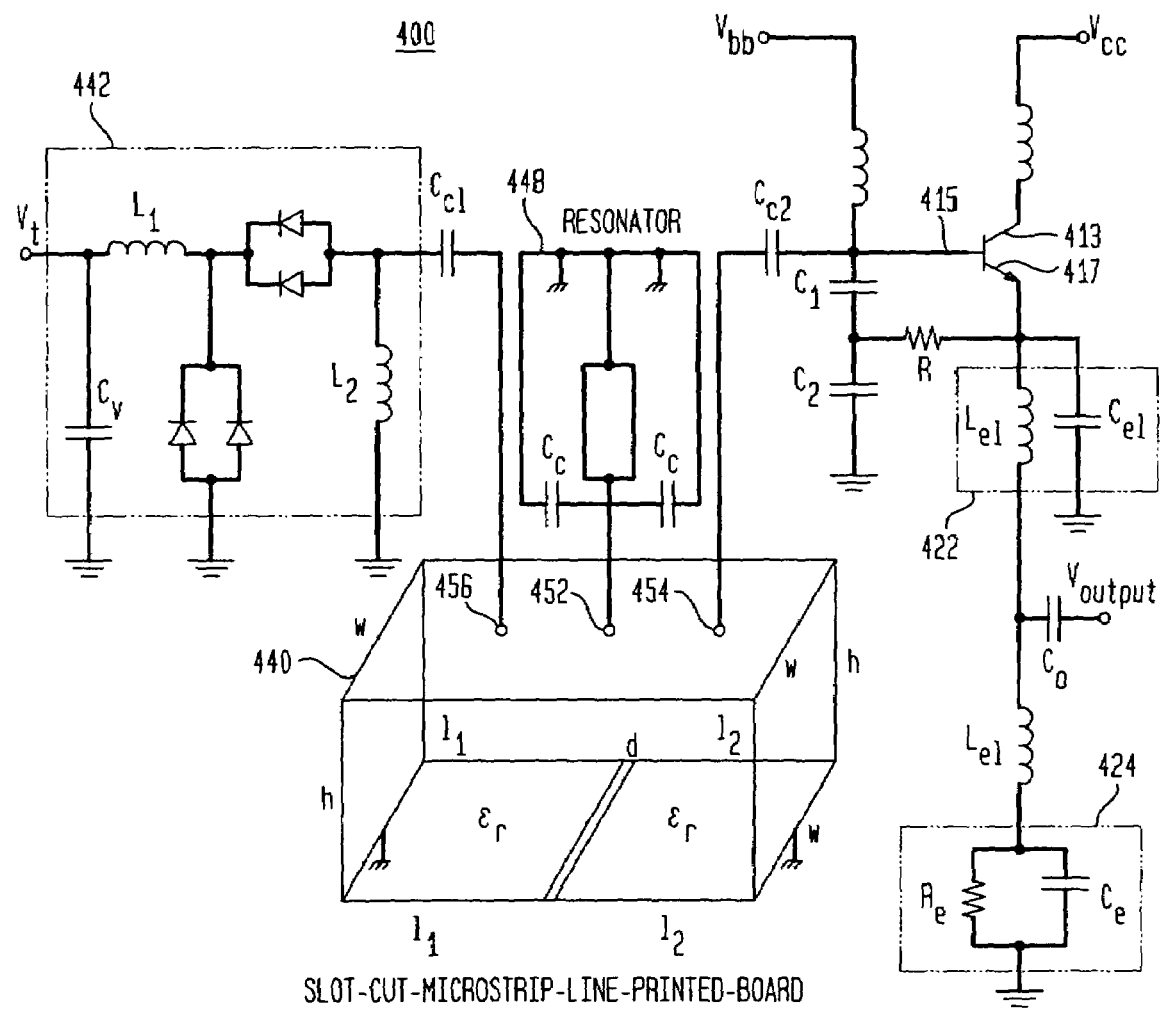
FIG. 4 depicts a schematic of an oscillator in accordance with an aspect of the present invention.

Turning now to FIG. 4, there is shown an oscillator 400 in accordance with another aspect of the present invention. The oscillator 400 includes a three-terminal device 410 that is inductively coupled to a bias voltage source $V_{cc}$ via first terminal 413. The second terminal 415 of the device 410 is inductively coupled to a second voltage source $V_{bb}$. A feedback capacitor $C_1$ is coupled to third terminal 417 through a resistor R. The third terminal 417 is also coupled to first and second filters, 422, 424, to provide regenerative filtering. In addition, the oscillator includes a slot-cut-microstrip-line-printed board 440 that is coupled to a tuning diode network 442, a resonator 448 and the second terminal 415 of the three terminal device 410. The tuning network 442 includes circuit elements that are similarly arranged as discussed above in relation to tuning network 329.

The resonator 448 is preferably a ceramic resonator and is capacitively coupled to terminal 452 of the slot-cut-microstrip-line-printed board 440. The tuning network 442 and second terminal 415 are similarly coupled to terminals 454 and 456 of the slot-cut-microstrip-line-printed board 440. As shown, the slot-cut-microstrip-line-printed board 440 includes a width, w, a height, h, and length dimensions, $l_1$ and $l_2$. The board 440 also includes a slot d that divides the base of the board 440 into two regions defined by length dimensions, $l_1$ and $l_2$. These dimensions define the size of the board 440 and can be selected to define the thermal profile of the oscillator. In accordance with this aspect of the present invention, the structure is designed to increase the loaded time average quality factor over the temperature range by selecting an optimum length-width ratio (L/W-ratio) of the each side of the slot-cut-microstrip-line coupling-capacitor. In general, the printed board 440 preferably comprises a variable capacitor or storage element that operates as an evanescent mode buffer and allows a user to define a thermal profile.

Figure 5:
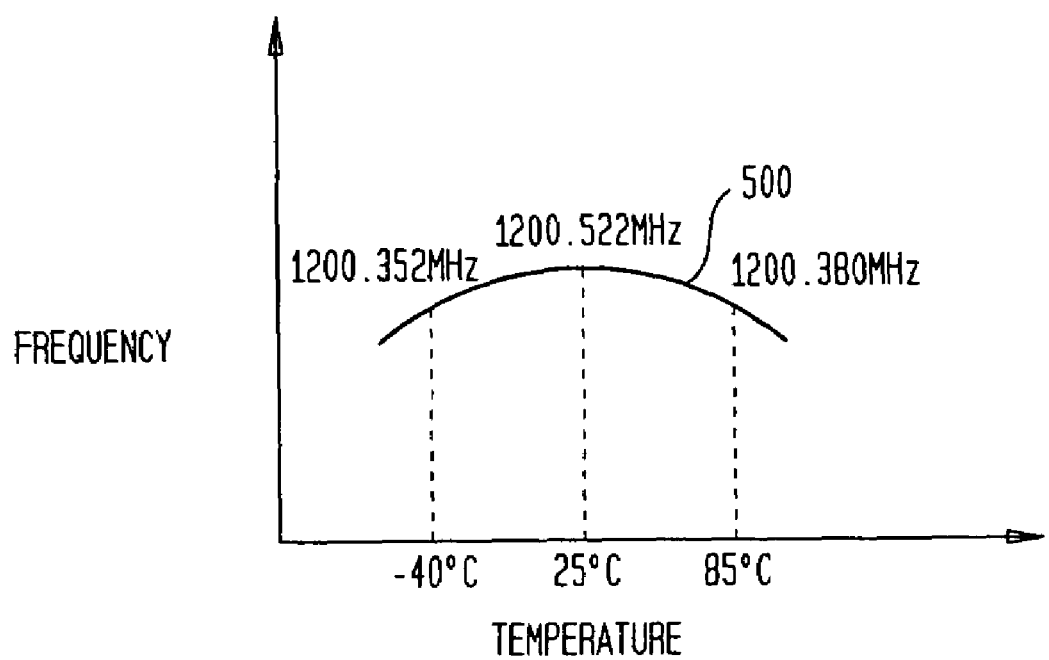
FIG. 5 illustratively depicts a user-definable thermal profile plot over the temperature range of −40° C. to +85° C. in accordance with an aspect of the present invention.
Figure 6:
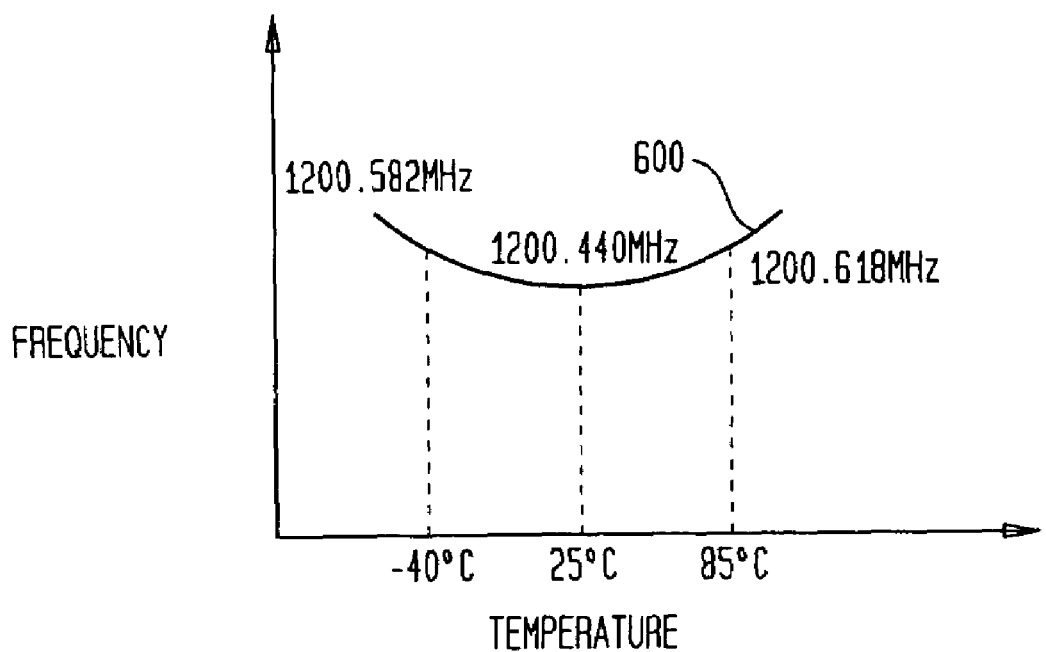
FIG. 6 illustratively depicts a user-definable thermal profile plot over the temperature range of −40° C. to +85° C. in accordance with an aspect of the present invention.
Figure 7:
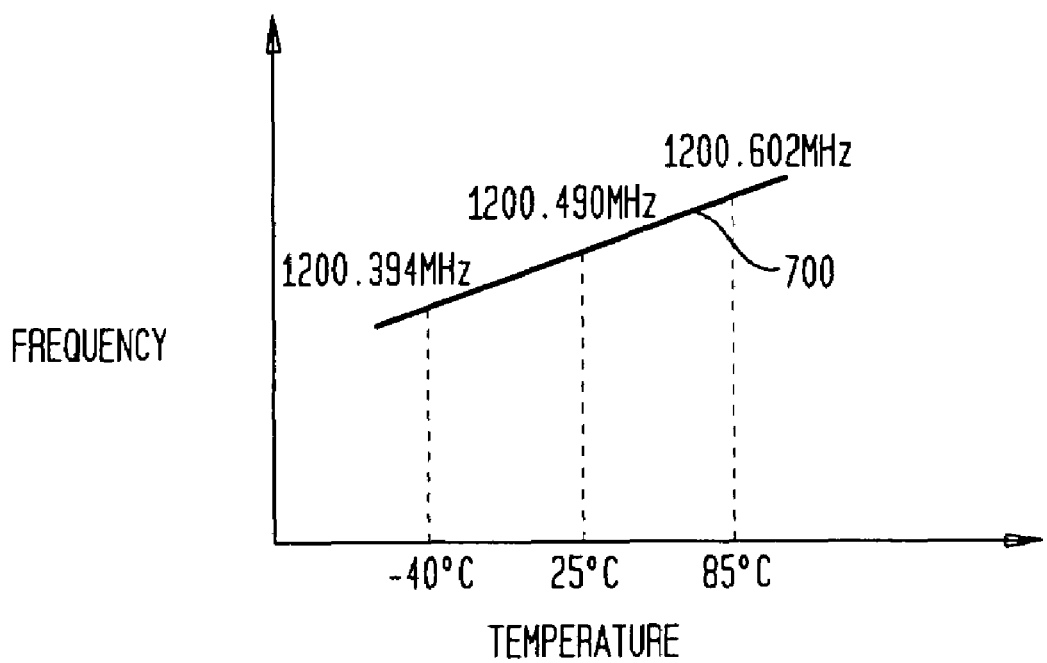
FIG. 7 illustratively depicts a user-definable thermal profile plot over the temperature range of −40° C. to +85° C. in accordance with an aspect of the present invention.
Figure 8:
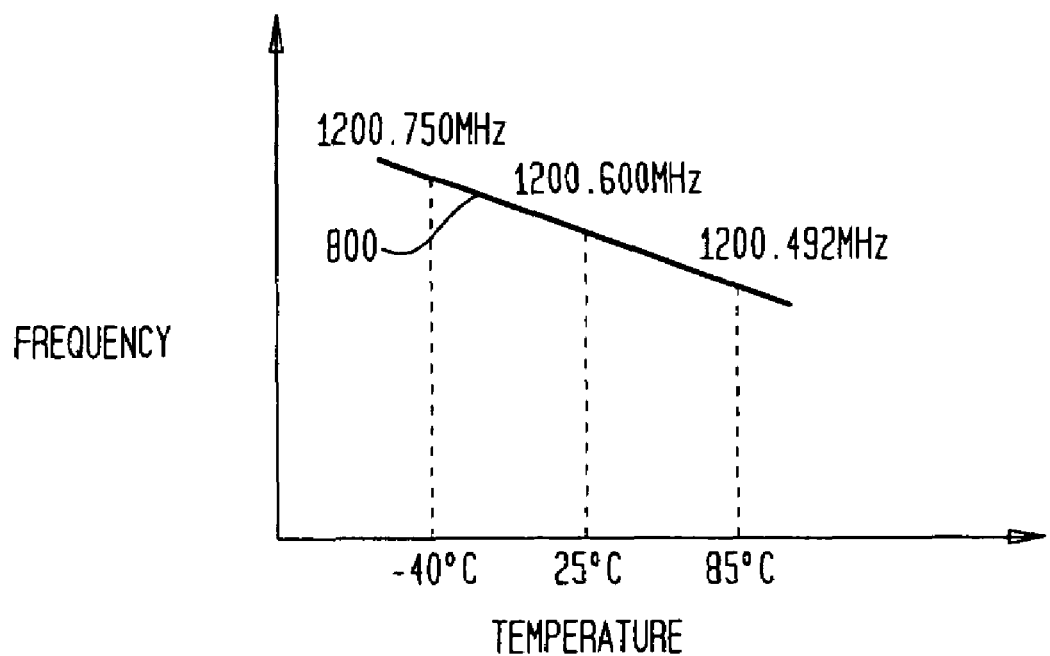
FIG. 8 illustratively depicts a user-definable thermal profile plot over the temperature range of −40° C. to +85° C. in accordance with an aspect of the present invention.

In particular, the L/W ratio and d may be selected so to provide a thermal profile as shown in FIGS. 5–8. For example, as shown in FIG. 5 the thermal profile 500 may designed to take the shape of a parabola over the operating temperature range of −40° C. to 85° C. The dimensions of the board 440 for providing a parabolic thermal profile as shown in FIG. 5 are as follows: $l_1/w_1=1$, $l_2/w_2=0.5$, d=0.01 inch, h=11 mils. In addition, $l_1$=0.06 inches, $w_1$=0.06 inches, $l_2$=0.03 inches, $w_2$=0.06 inches and $e_r$=10. FIGS. 6–8 may be achieved by adjusting the ratios of l/w. Furthermore, by changing the dimensions of the board, different user definable profiles may be achieved. As shown, in FIG. 6 the thermal profile 600 may take the shape of an inverted parabola. FIGS. 7 and 8 illustrate linear thermal profiles 700, 800. In addition, as shown in FIGS. 7 and 8 the thermal drift is less than 100 kHz.

Figure 9:
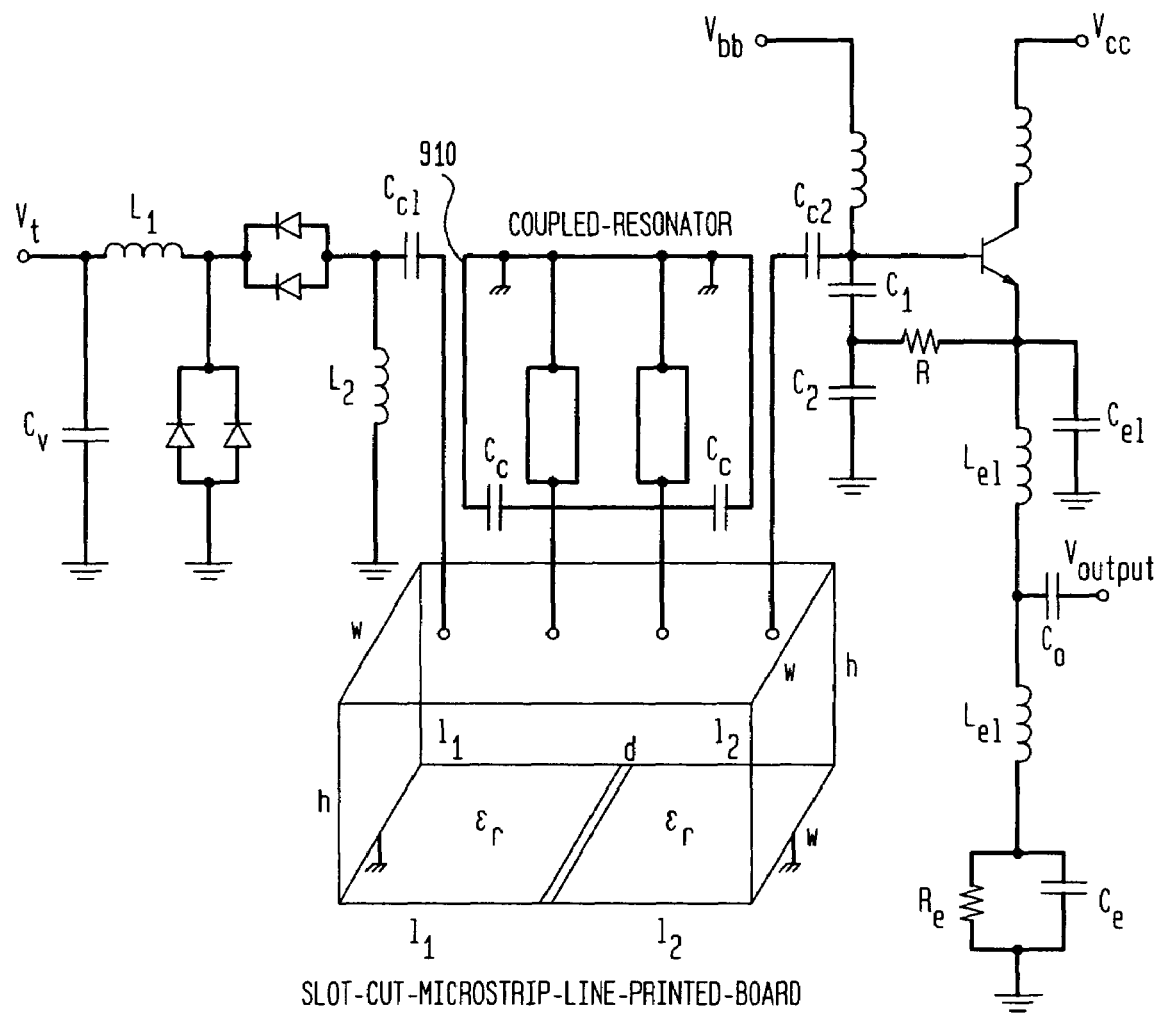
FIG. 9 depicts a schematic of an oscillator in accordance with an aspect of the present invention.

Turning now to FIG. 9, there is shown an oscillator 900 in accordance with an aspect of the present invention. The oscillator 900 includes similar circuitry to FIG. 5 except that the resonator 910 includes a pair of ceramic resonators coupled in parallel with each other.

Figure 10:
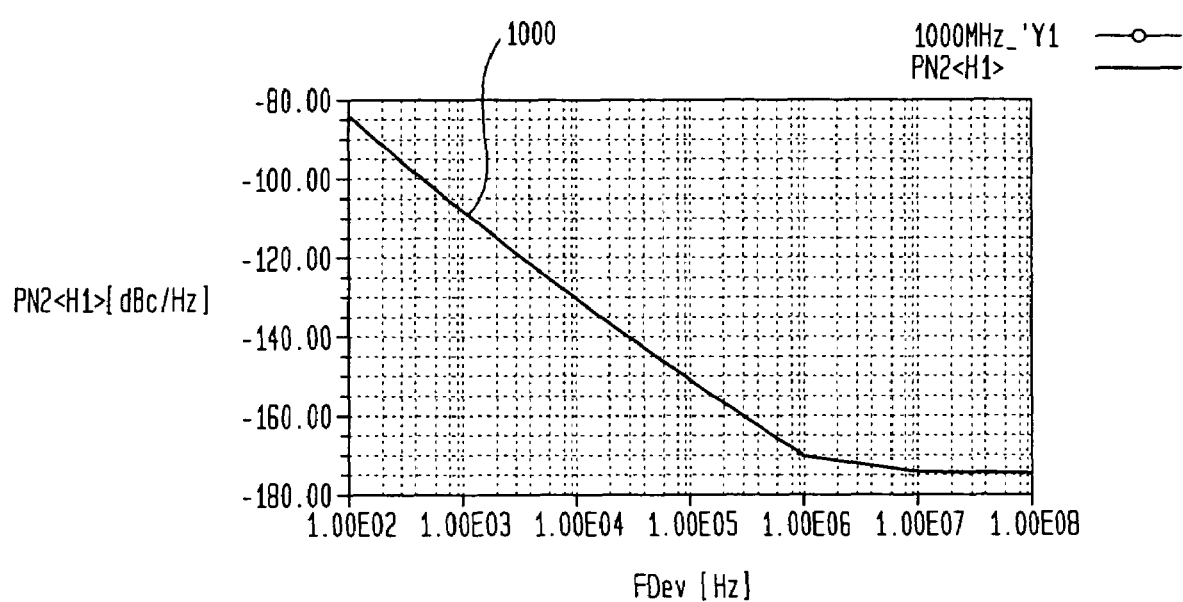
FIG. 10 illustratively depicts a phase noise plot of an oscillator implemented in accordance with an aspect of the present invention.

FIG. 10 shows a phase noise plot 1000 of an oscillator operating at 1200 MHz in accordance with an aspect of the present invention. As FIG. 10 shows, the phase noise is approximately −110 dBc/Hz at 1 kHz.

Figure 11:
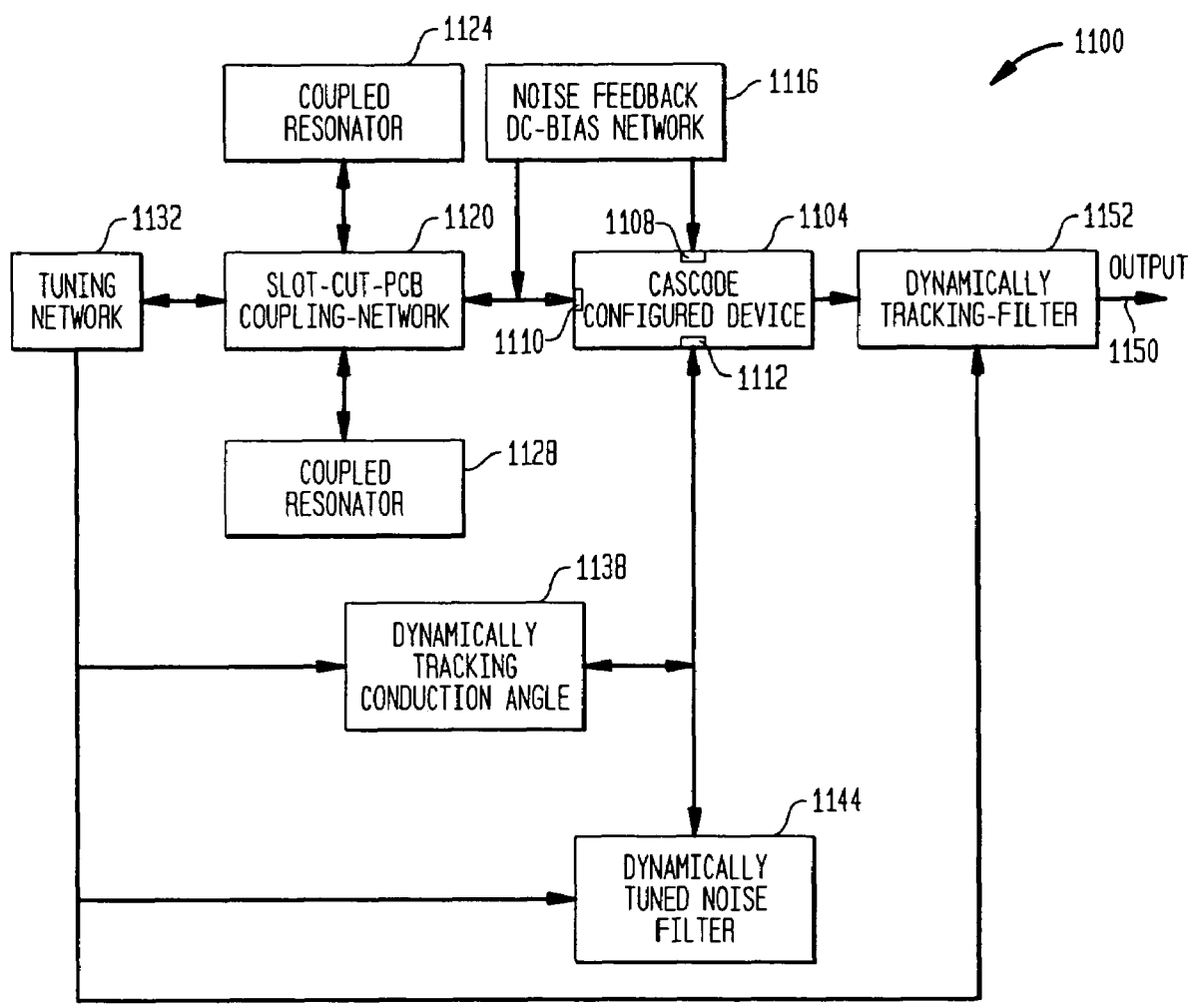
FIG. 11 is a block diagram illustrating an oscillator in accordance with an aspect of the present invention.

Turning now to FIG. 11, there is shown a block diagram of an oscillator 1100 in accordance with an aspect of the present invention. The oscillator 1100 comprises a cascode configured device 1104 having first, second and third terminals 1108, 1110, and 1112, respectively. A noise feedback and DC-bias circuit or network 1116 is coupled between the first and second terminals, 1108 and 1110. The noise feedback and DC bias circuit 1116 is used to supply a bias voltage to the cascode configured device 1104. The noise feedback and DC bias circuit 1116 also feedbacks a select amount of phase noise from the first terminal 1108 to the second terminal 1110 of the cascode configured device 1104.

The cascode configured device 1104 preferably comprises a pair of active devices arranged in a common emitter common collector configuration so that both active devices share the same emitter current. Each of the active devices may comprise any three-terminal device that can provide a 180° phase shift between any two terminals and preferably comprises bipolar or field effect transistors.

A slot-cut printed circuit board 1120 is coupled to the second terminal 1110 and to a pair of resonators 1124, 1128. As shown, the resonators 1124, 1128 are preferably coupled to each other through the slot-cut printed circuit board 1120. The slot-cut printed circuit board may be implemented using microstripline or stripline technology as is discussed in further detail below. In accordance with an aspect of the present invention, the slot-cut printed circuit board 1120 is integrated with the resonators 1124, 1128 and operates as a coupling capacitor between the resonators 1124, 1128 and the cascode-configured device 1104. In that way, the slot-cut printed circuit board 1120 acts as an evanescent mode buffer that improves the dynamic loaded Q of the resonators by storing additional energy that may develop in the oscillator under a large signal drive level condition (narrow conduction angle). The additional energy may then be released to compensate for the dynamic loss resistance of the resonator, therefore resulting in minimization of the noise factor of the circuit and low phase noise performance. Further, the coupling structure may be implemented with a distributed coupled resonator or a lumped element to improve the dynamic loaded Q.

In the preferred embodiment, the coupled resonators 1124, 1128 comprise high Q resonators (ceramic or surface acoustic wave (SAW) resonators). A ceramic resonator, which may be depicted as a quartz-crystal in an equivalent circuit, can generally achieve better phase noise performance than SAW resonators. Ceramic resonators, on the other hand, typically have some performance flaws such as susceptibility to microphonic noise, jitter and typically a lower Q factor than a SAW resonator. In accordance with this aspect of the present, however, by coupling and dynamically tuning the resonators, the Q factor of a ceramic resonator can be optimized at a desired frequency over the frequency tuning range. In that regard, two or more resonators operating at the same resonance frequency, if coupled optimally, give an improved Q factor over a single resonator. However, if the resonance frequency of the resonators are not the same, the Q factor may be degraded, thereby causing poor phase performance. There are limits with regard to the degree of precision that can be achieved in the manufacture of ceramic resonators, i.e., so called manufacturing tolerances. Therefore, a limitation on the Q factor of the coupled resonators is imposed due to the variation in resonance frequency caused by the manufacturing process, e.g., from batch to batch. Generally, the effective Q of coupled resonators is typically not better than that of the individual resonators, if the resonance frequency is different due to manufacturing tolerances. In accordance with this aspect of the present invention, a difference in resonance frequencies between the individual resonators can be compensated for by incorporating capacitive coupling using an evanescent medium between the resonators so that the rate of change of phase at a resonance frequency can be optimized for maximum group delay, thereby improving the loaded Q factor of the oscillator/VCOs. An alternative approach is to electronically tune the value of the coupling capacitor between the resonators so that the rate of change of phase can be optimized over the tuning range for better phase noise performance over the frequency band.

As FIG. 11 also shows, a tuning network 1132 is also coupled to the slot-cut printed circuit board 1120. The tuning network 1132 may comprise one or more tuning diodes arranged to form a network (as is discussed below) that allows tuning of the operating or oscillating frequency of the oscillator 1100 over a band. The tuning network 1132 is also coupled to circuit block 1138. The circuit block 1138 is also coupled to the third terminal 1112 of the cascode device and is operative to dynamically track the conduction angle of the cascode-configured device 1104.

A dynamically tunable noise filter 1144 is also coupled between the third terminal 1112 of the cascode device 1104 and the tuning network 1132 in parallel with the circuit block 1138. In addition, an output signal 1150 is provided through a dynamically tracking filter 1152, which is coupled to the cascade device 1104. In accordance with an aspect of the present invention, the conduction angle, drive levels, noise filtering and output track filtering are dynamically tuned together thereby dynamically tuning the phase noise performance of the oscillator over the tuning band. The average noise factor of the oscillator circuitry is preferably minimized by the noise feedback circuit 1116 and dynamically controlling the conduction angle of the active devices that comprise the cascade device by adjusting the drive level corresponding to the desired oscillation frequency. Most preferably, and for optimum phase noise performance over the tuning range, the conduction angle is tuned dynamically and synchronized with the noise filtering at the emitter of an active three-terminal device (bipolar transistor or FET) employing a tracking filter at the output. For applications where phase noise performance at a lower offset frequency (e.g., at 1 KHz offset from the carrier frequency) is desired, that performance may be achieved by incorporating noise filtering across the base of one of the three-terminal device comprising the cascade device and across the emitter of the other three-terminal device that comprise the cascode device.

In operation the oscillator 1100 preferably operates as follows. A DC voltage is applied through noise feedback and DC bias circuitry 1116. This DC voltage operates to properly bias the cascode-configured device 1108, i.e., by properly biasing the active devices that comprise the cascode-configured device. A select amount of phase noise is fed to the cascode-configured device 1108 at the second terminal 1110 to cause an oscillating condition. The selection of the values of the electrical components that comprise the circuitry of each block, as well as the frequency of the resonators, determine the resonance frequency of the oscillator, i.e., the frequency of the signal at the output 1150. As a voltage associated with the tuning network (e.g., tuning voltage $V_{tune}$) is adjusted, the resonance frequency is tuned over a frequency band. As the tuning voltage is adjusted, the conduction angle, drive levels, noise filtering and output track filtering are dynamically tuned together thereby dynamically tuning the phase noise performance of the oscillator over the tuning band. In particular, the average noise factor of the oscillator circuitry is minimized by the noise feedback circuit 1116 and block 1138, which dynamically controls the conduction angle of the active devices that comprise the cascade device by adjusting the drive level corresponding to the desired oscillation frequency.

The effective Q factor of the coupled resonators is at the same time compensated for by the capacitive coupling provided by the slot-cut printed circuit board 1120 coupling network 1120 so that rate of change phase at the resonance frequency is optimized over the tuning range. In this way, the slot-cut printed circuit board 1120 operates as an evanescent mode buffer as described above.

Figure 12:
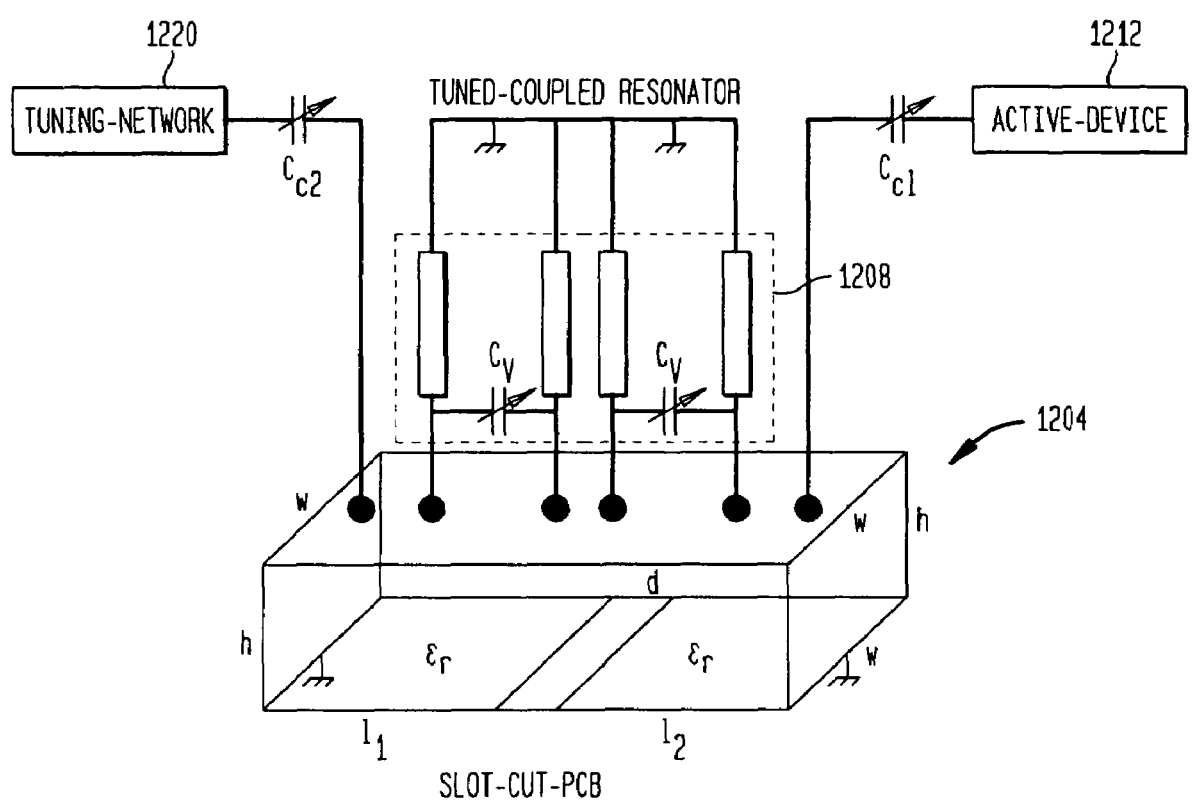
FIG. 12 is a diagram illustrating a slot-cut printed circuit board and a resonator network in accordance with an aspect of the present invention.

FIG. 12 illustratively depicts a slot-cut printed circuit board 1204 coupled to a tuned-coupled resonator network 1208. The slot-cut board 1204 is capacitively coupled between an active device block 1212 and a tuning network 1220. As previously discussed, the slot-cut-microstrip-line-printed board 1204 includes a width, w, a height, h, and length dimensions, $l_1$ and $l_2$. The board 1204 also includes a slot d that divides the base of the board 1204 into two regions defined by length dimensions, $l_1$ and $l_2$. In accordance with this aspect of the present invention, the structure is designed to increase the loaded time average quality factor over the temperature range by selecting an optimum length-width ratio (L/W-ratio) of the each side of the slot-cut-microstrip-linecoupling-capacitor. In general, the printed board 1204 preferably comprises a variable capacitor or storage element that operates as dynamic evanescent mode buffer.

As is also discussed above, the dimensions of the printed board 1204 may be selected so as to define the thermal profile over the operating temperature range of the oscillator.

Figure 13:
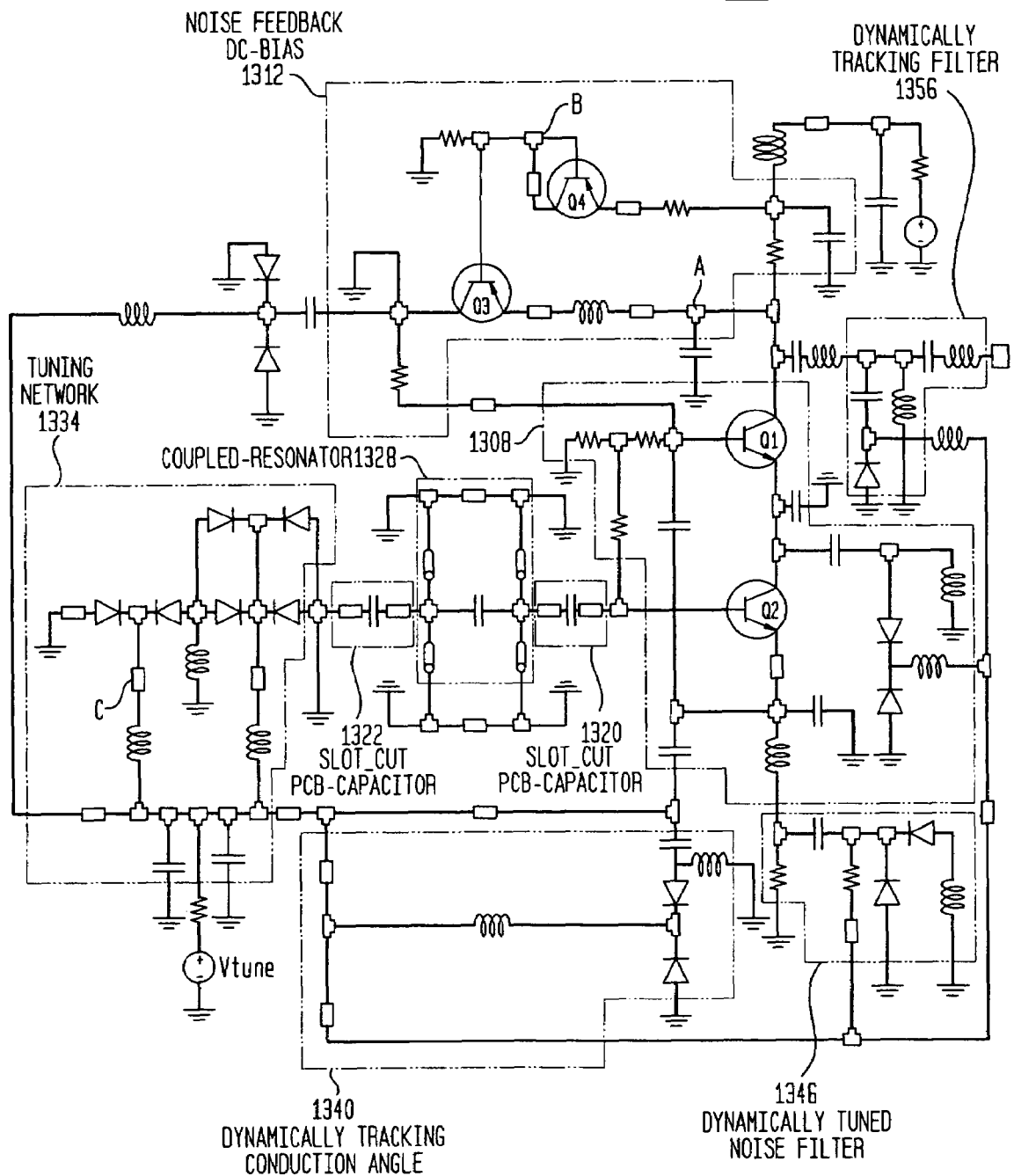
FIG. 13 is a circuit diagram illustrating an oscillator in accordance with an aspect of the present invention.

Turning now to FIG. 13, there is shown a circuit diagram of a voltage controlled oscillator 1300 in accordance with an aspect of the present invention. With regard to FIG. 13, the blocks labeled A, B, and C represent T-connectors, 4-way connectors and transmission lines respectively. Other similar blocks, although not labeled with an A, B, or C also represent the foregoing respective electrical elements. The oscillator 1300 operates in accordance with foregoing description. In particular, the oscillator 1300 includes a pair of bipolar transistors Q1 and Q2 arranged in a cascode configuration block 1308. The transistors Q1 and Q2 are coupled together in a common collector and emitter configuration so that both devices share the same emitter current. A DC biasing and noise feedback block 1312 is coupled to the cascode block 1308. The slot printed circuit board are shown as blocks 1320, 1322. A coupled resonator network or circuitry 1328 is coupled between the blocks 1320 and 1322. A tuning network is shown as block 1334 and is coupled a voltage source $V_{tune}$. Circuitry for dynamically tracking the conduction angle is shown as block 1340. Dynamically tunable noise filter and tracking filter are respectively illustrated as blocks 1346 and 1356, respectively.

Figure 14:
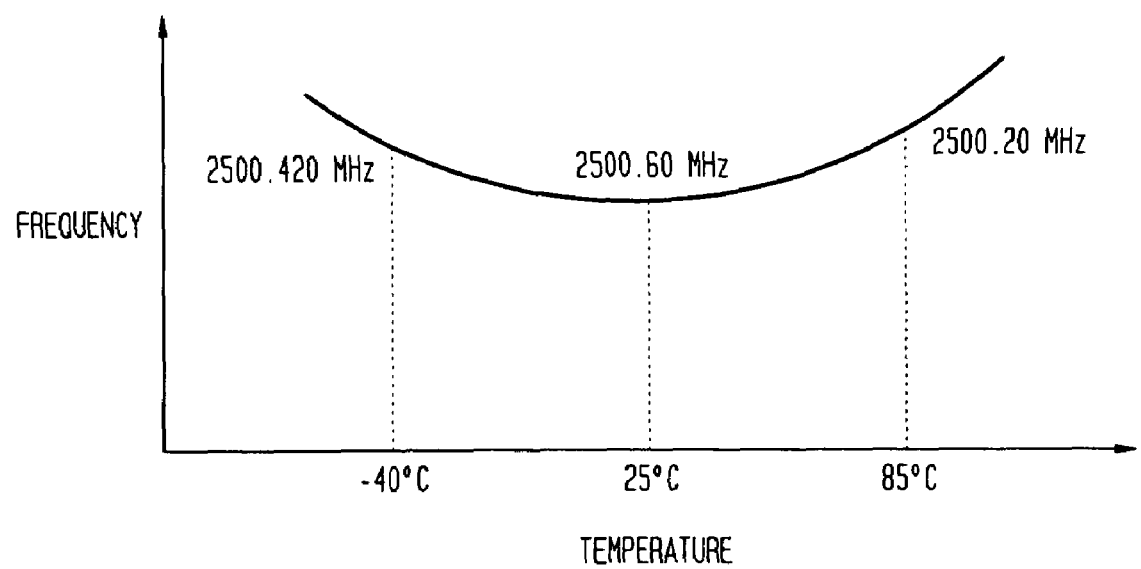
FIG. 14 shows a thermal profile plot over the temperature range of −40° C. to +85° C. of an oscillator implemented in accordance with an aspect of the present invention.

Turning now to FIG. 14, there is shown a thermal drift profile of an oscillator implemented in accordance with the circuitry shown in FIG. 13. The values of the circuit elements were chosen such that the circuit oscillates at a fundamental frequency of 2500 MHz or 2.5 GHz. (Other values may be chosen to have the circuit operate at difference frequencies.) As FIG. 14 shows, the dimensions of the slot-cut printed circuit board were selected to produce a parabola over the operating temperature range.

Figure 15:
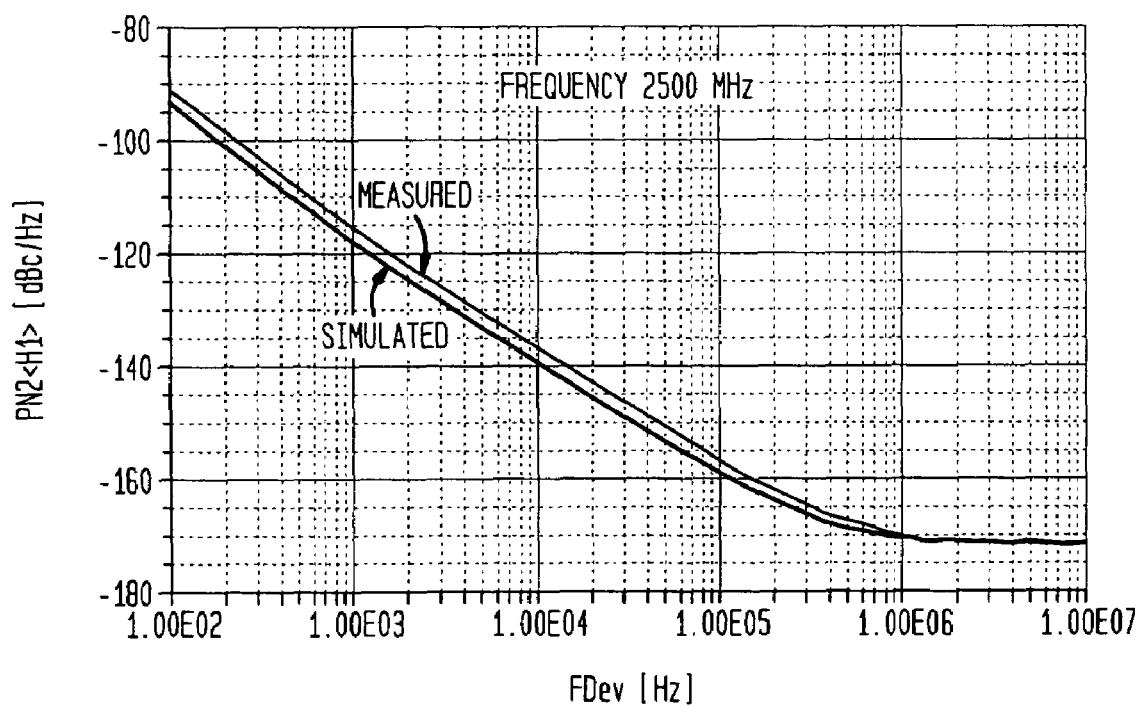
FIG. 15 illustratively depicts a phase noise plot of an oscillator implemented in accordance with an aspect of the present invention.
Figure 16:
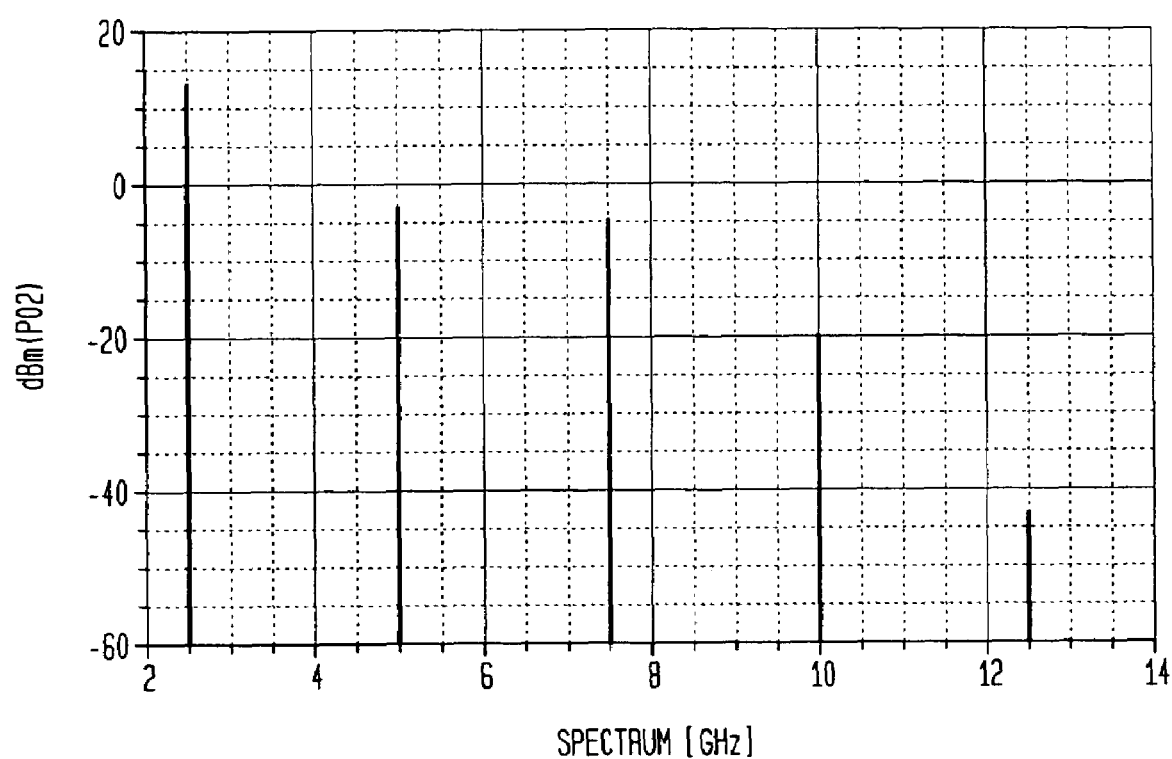
FIG. 16 illustratively depicts a plot of the output power at the fundamental frequency and harmonics of an oscillator implemented in accordance with an aspect of the present invention.

FIG. 15 is a plot of the measured phase noise for a oscilaltor in accordance with an aspect of the present invention. The oscillator oscillated at a frequency of 2.5 Ghz and the measured phase noise is better than −115 dBc at 1 KHz offset from the oscillation frequency. FIG. 16 shows the output power and harmonics at the 2.5 GHz oscillation frequency.

A voltage-controlled oscillator implemented in accordance with the present invention may be employed in any number of devices that are used to communicate on data, telephone, cellular or, in general, communications network. Such devices may include but are not limited to, for example, cellular phones, personal digital assistants, modem cards, lap tops, satellite telephones. As a general matter, the oscillator circuitry shown in the various drawings and described above may be employed in a PLL to either generate a clock signal that may be used to transmit or recover information transmitted or received over a network. In addition to wireless networks, the circuitry of the present invention may be employed in wired networks, satellite networks, etc.

In addition, and in accordance with additional aspects of the present invention, the slot-cut-microstrip-line board or coupling capacitor as described above may be further integrated with the coupled resonator oscillators disclosed in commonly assigned U.S. patent application Ser. Nos. 10/912,209 and 10/937,525, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An oscillator, comprising:
   a cascode configured device having first, second and third terminals;
   a plurality of resonators; and
   first circuitry coupled between the plurality of resonators and the second terminal of the cascode configured device, the circuitry being operable as an evanescent mode buffer to compensate for changes in the capacitance of the oscillator during operation.

2. The oscillator of claim 1, wherein the first circuitry comprises a slot-cut microstripline printed circuit board.

3. The oscillator of claim 1, further comprising second circuitry coupled across the third terminal of the active device and the first circuitry, the second circuitry being operable to track the conduction angle of the cascode configured device.

4. The oscillator of claim 1, wherein the first circuitry is operable to select an operating frequency associated with the oscillator.

5. The oscillator of claim 1, wherein the cascode configured device comprises first and second transistors connected in a common collector common emitter configuration.

6. The oscillator of claim 5, wherein the transistors comprise field effect transistors.

7. The oscillator of claim 5, wherein the transistors comprise bipolar transistors.

8. The oscillator of claim 1, further comprising a filter coupled between the third terminal of the cascode configured device and the first circuitry and operable to degeneratively filter and feedback a select amount of phase noise from the cascode configured device to the first circuitry.

9. The oscillator of claim 1, wherein the resonators comprise ceramic resonators.

10. A voltage controlled oscillator, comprising:
    a cascode configured device having first, second and third terminals; and
    a pair of coupled resonators including a slot-cut-microstripline circuitry connected to the second terminal of the cascode configured device, the slot-cut-microstripline circuitry operating as a coupling capacitor between the resonators and the cascode configured device.

11. The voltage controlled oscillator of claim 10, wherein a capacitance value associated with the slot-cut-microstripline circuitry is electronically tunable.

12. The voltage controlled oscillator of claim 10, further comprising circuitry coupled across the third terminal of the cascode configured device and the slot-cut-microstripline circuitry and operable to track the conduction angle of the cascode configured device.

13. The voltage controlled oscillator of claim 10, further comprising a tuning network for dynamically tuning the operating frequency of the oscillator.

14. The voltage controlled oscillator of claim 13, wherein the capacitance value associated with the slot-cut-microstripline circuitry is dynamically tuned in response to adjustments of the tuning network.

15. The voltage controlled oscillator of claim 14, further comprising circuitry coupled across the third terminal of the cascode configured device and the slot-cut-microstripline circuitry and operable to track the conduction angle of the cascode configured device in response to adjustments of the tuning network.

16. The voltage-controlled oscillator of claim 15, further comprising a dynamically tunable filter coupled across the third terminal of the cascode configured device and the slot-cut-microstripline circuitry and operable to degeneratively filter and feedback a select amount of phase noise from the cascode configured device to slot-cut-microstripline circuitry in response to adjustments of the tuning network.

17. The voltage-controlled oscillator of claim 10, wherein the resonators comprise ceramic resonators.

18. The voltage controlled oscillator of claim 10, wherein the cascode configured device comprises first and second transistors connected in a common collector common emitter configuration.

19. A voltage controlled oscillator, comprising:
a cascode configured device having first, second and third terminals and comprising a pair of transistors arranged in a common collector and emitter configuration;
a voltage tuning network; and
a dynamically tuned coupled resonator including a slot-cut-mincrostripline printed circuit board connected to the second terminal of the cascode configured device and operable to select an operating frequency of the oscillator in response to a voltage adjustment associated with the voltage tuning network.

20. The voltage controlled oscillator of claim 19, further comprising circuitry coupled between the third terminal and the dynamically tuned coupled resonator for dynamically tracking the conduction angle of the cascode configured device.

21. The voltage controlled oscillator of claim 19, further comprising a dynamically tuned noise filter coupled across the third terminal and the dynamically tuned coupled resonator, the noise filter being operable to degeneratively filter a select amount of phase noise to the cascode configured device.

22. An apparatus, comprising:
a phase lock loop for generating a clock signal used to transmit or recover information communicated from or to the apparatus, the phase lock loop comprising a voltage a-controlled oscillator for generating the clock signal, the voltage controlled oscillator comprising:
a cascode configured device having first, second and third terminals;
a plurality of resonators; and
first circuitry coupled between the plurality of resonators and the second terminal of the cascode configured device, the circuitry being operable as a evanescent mode buffer to compensate for changes in the capacitance of the oscillator during operation.

23. The apparatus of claim 22, wherein the apparatus comprises a wireless device.

24. The apparatus of claim 23, wherein the wireless device is a cellular telephone.

25. The apparatus of claim 22, wherein the apparatus comprises a personal digital assistant.

26. The apparatus of claim 22, wherein the apparatus comprises a telephone.

* * * * *